(12) United States Patent
Shin et al.

(10) Patent No.: US 10,983,563 B2
(45) Date of Patent: Apr. 20, 2021

(54) FLEXIBLE DISPLAY MODULE AND ELECTRONIC DEVICE COMPRISING THE SAME

(71) Applicant: LG Display Co., Ltd., Seoul (KR)

(72) Inventors: Insik Shin, Paju-si (KR); Byeongjo Min, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/703,311

(22) Filed: Dec. 4, 2019

(65) Prior Publication Data
US 2020/0192431 A1 Jun. 18, 2020

(30) Foreign Application Priority Data
Dec. 13, 2018 (KR) .......................... 10-2018-0161384

(51) Int. Cl.
*G06F 1/16* (2006.01)
*H05K 1/18* (2006.01)

(52) U.S. Cl.
CPC ........... *G06F 1/1652* (2013.01); *H05K 1/189* (2013.01); *H05K 2201/10128* (2013.01)

(58) Field of Classification Search
CPC .... G06F 1/1652; G06F 1/1626; G06F 1/1656; G06F 1/203; G06F 3/04164; H05K 1/189; H05K 2201/10128; G09F 9/301
See application file for complete search history.

(56) References Cited

U.S. PATENT DOCUMENTS

| | | | | |
|---|---|---|---|---|
| 5,442,470 | A * | 8/1995 | Hashimoto | G02F 1/133308 349/149 |
| 8,062,930 | B1 * | 11/2011 | Shah | C25D 5/12 438/110 |
| 2009/0138695 | A1 * | 5/2009 | Jung | G02F 1/133308 713/2 |
| 2010/0108370 | A1 * | 5/2010 | Kapusta | H05K 1/181 174/260 |
| 2015/0253613 | A1 * | 9/2015 | Yoon | G02F 1/13452 349/58 |
| 2017/0311442 | A1 * | 10/2017 | Eom | H05K 3/30 |
| 2019/0090350 | A1 * | 3/2019 | Kumar | H05K 3/4644 |
| 2019/0373719 | A1 * | 12/2019 | Lee | H01L 51/5281 |
| 2019/0380197 | A1 * | 12/2019 | Lee | H05K 1/028 |

* cited by examiner

*Primary Examiner* — Abhishek M Rathod
(74) *Attorney, Agent, or Firm* — Fenwick & West LLP

(57) ABSTRACT

A flexible display module and an electronic device comprising the same are disclosed, wherein the flexible display module covers uneven surface portions of a flexible circuit board, and protecting circuit components mounted on the flexible circuit board. The flexible display module comprises a flexible display panel including a display portion and a display pad portion disposed on a flexible substrate, a flexible circuit board connected with the display pad portion and arranged in a rear surface of the flexible display panel, and a cover member attached to the rear surface of the flexible display panel and configured to cover uneven surface portions of the flexible circuit board, wherein the cover member includes a cover body portion overlapped with the flexible circuit board, and an adhesion portion connected with both sides of the cover body portion and attached to the rear surface of the flexible display panel.

18 Claims, 8 Drawing Sheets

FLEXIBLE DISPLAY MODULE AND ELECTRONIC DEVICE COMPRISING THE SAME

CROSS-REFERENCE TO RELATED APPLICATIONS

This application claims the benefit of Republic of Korea Patent Application No. 10-2018-0161384 filed on Dec. 13, 2018, which is hereby incorporated by reference in its entirety.

BACKGROUND

Technical Field

The present disclosure relates to a flexible display module and an electronic device comprising the same.

Discussion of the Related Art

Generally, an electronic device such as a television, a monitor, a notebook computer, a smart phone, a tablet computer, an electronic pad, a wearable device, a watch phone, a mobile information device, a navigation, or a vehicle control display device is realized in a multimedia player type having complex function of an image displaying, photo shooting or video recording, audio or video file playing, game, or broadcasting receiving.

The electronic device may include a housing, a flexible display module received in the housing, a flexible circuit board connected with the flexible display module, and a cover window configured to cover the flexible display module. A pad portion of the flexible display module may be bent to reduce a bezel width of the electronic device, and the flexible circuit board connected with the pad portion may be disposed in a rear surface of the display module.

However, in case of a general electronic device, an uneven surface portion may be generated in the flexible circuit board due to a bending repulsive force of the flexible display module, and circuit components mounted on the flexible circuit board may be damaged due to a physical contact between the flexible circuit board and structures caused by the uneven surface portion of the flexible circuit board.

The above content of the background technology may be retained for a deduction of the present disclosure by inventors, or may be technology information learned by practice of embodiments of the present disclosure. However, the above content of the background technology may be not a prior art published to the general public before an application of the present disclosure.

SUMMARY

The present disclosure has been made in view of the above problems, and it is an object of the present disclosure to provide a flexible display module capable of preventing uneven surface portions of a flexible circuit board, and protecting circuit components mounted on the flexible circuit board, and an electronic device comprising the same.

In accordance with an aspect of the present disclosure, the above and other objects can be accomplished by the provision of a flexible display module comprising a flexible display panel including a flexible display panel including a display portion that displays an image via a front surface of the flexible display panel and a display pad portion that does not display the image, the display portion and the display pad portion disposed on a flexible substrate; a flexible circuit board connected with the display pad portion, the flexible circuit board arranged on a rear surface of the flexible display panel that is opposite the front surface; and a cover member attached to the rear surface of the flexible display panel, the cover member covering uneven surface portions of the flexible circuit board, wherein the cover member includes: a cover body portion that overlaps the flexible circuit board, the cover body portion including a plurality of ends; and a plurality of adhesion portions attached to the rear surface of the flexible display panel, each of the plurality of adhesion portions extending from a corresponding one of the plurality of ends of the cover body portion.

In accordance with another aspect of the present disclosure, there is provided an electronic device comprising a cover window, a flexible display module connected with the cover window, and a housing configured to support the cover window and to receive the flexible display module therein. The flexible display modules includes a display portion that displays an image via a front surface of the flexible display panel and a display pad portion that does not display the image, the display portion and the display pad portion disposed on a flexible substrate; a flexible circuit board connected with the display pad portion, the flexible circuit board arranged on a rear surface of the flexible display panel that is opposite the front surface; and a cover member attached to the rear surface of the flexible display panel, the cover member covering uneven surface portions of the flexible circuit board, wherein the cover member includes: a cover body portion that overlaps the flexible circuit board, the cover body portion including a plurality of ends; and a plurality of adhesion portions attached to the rear surface of the flexible display panel, each of the plurality of adhesion portions extending from a corresponding one of the plurality of ends of the cover body portion.

According to one or more embodiments of the present disclosure, it is possible to prevent uneven surface portions of the flexible circuit board, and to protect the circuit components mounted on the flexible circuit board.

In addition to the objects of the present disclosure as mentioned above, additional objects of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
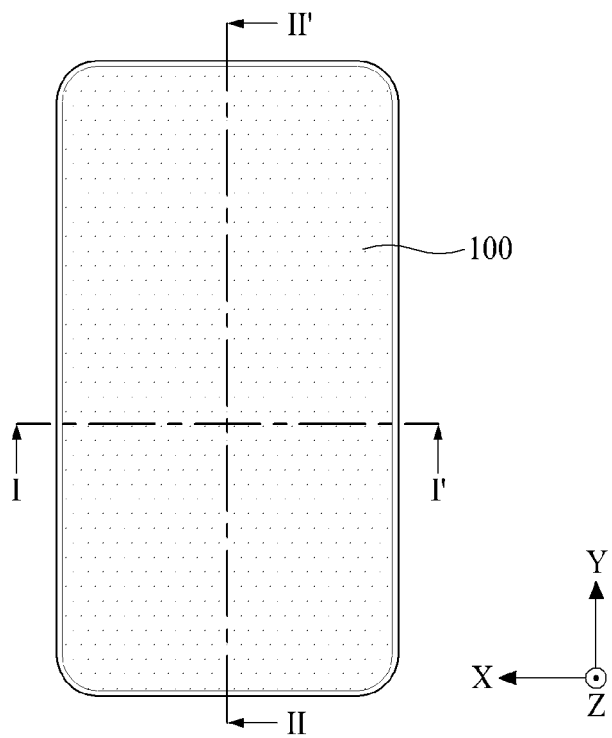
FIG. 1 is a plane view illustrating an electronic device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a flexible display module according to the embodiments of the present disclosure and an electronic device comprising the same will be described in detail with reference to the accompanying drawings. In the drawings, the same or similar elements are denoted by the same reference numerals even though they are depicted in different drawings.

Figure 2:
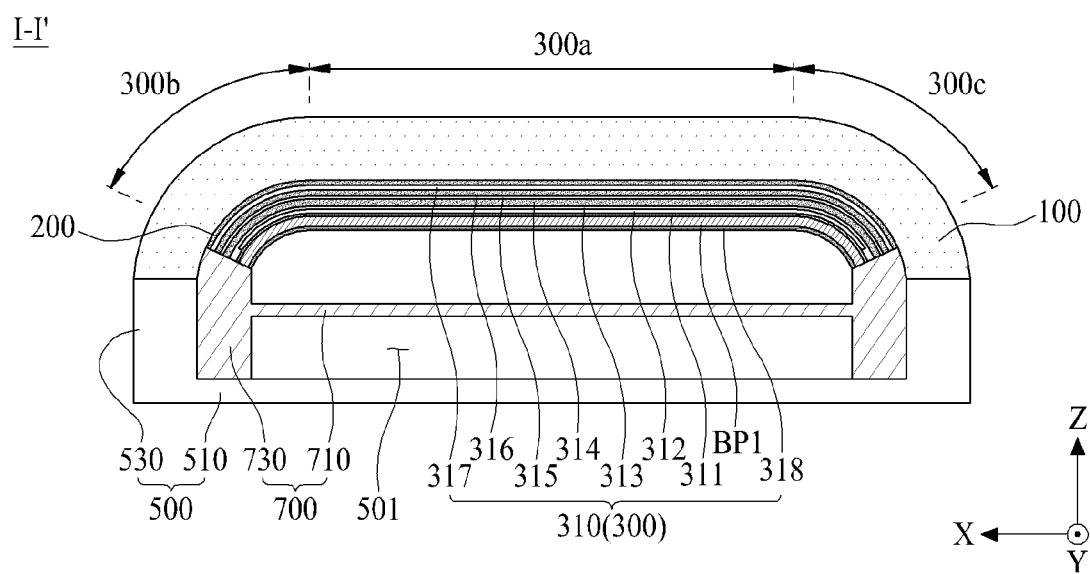
FIG. 2 is a cross sectional view along I-I' of FIG. 1 according to one embodiment of the present disclosure.
Figure 3:
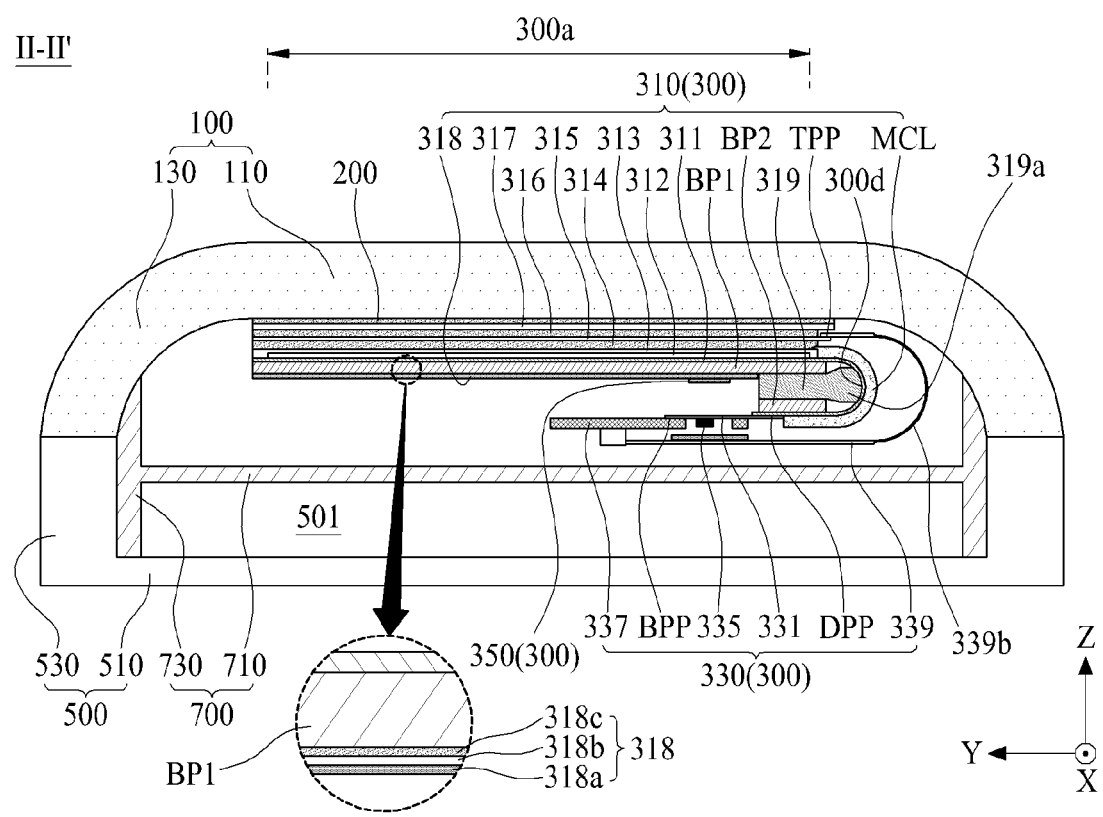
FIG. 3 is a cross sectional view along II-II' of FIG. 1 according to one embodiment of the present disclosure.
Figure 4:
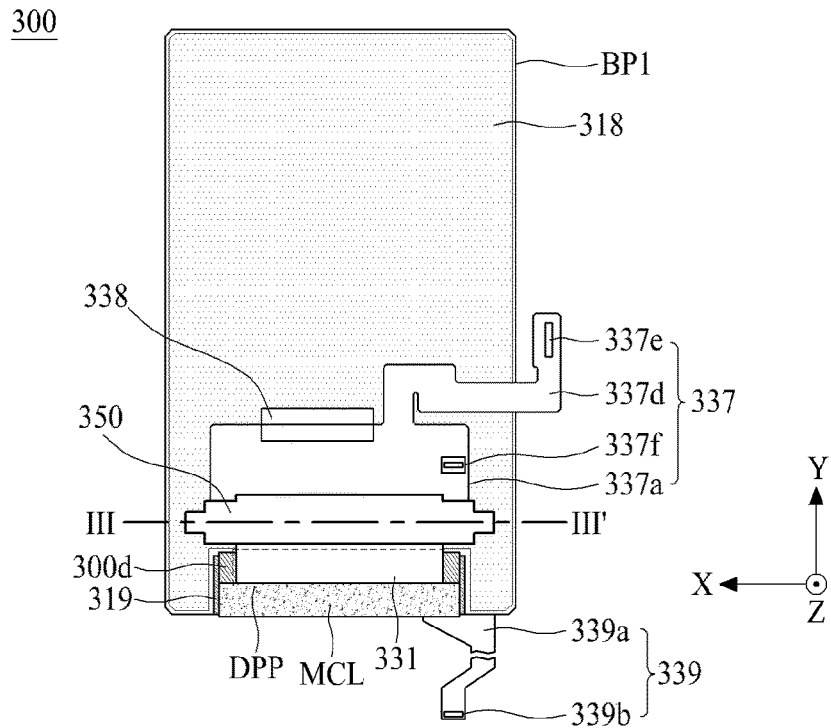
FIG. 4 illustrates a rear surface of a flexible display module shown in FIG. 3 according to one embodiment of the present disclosure.
Figure 5:
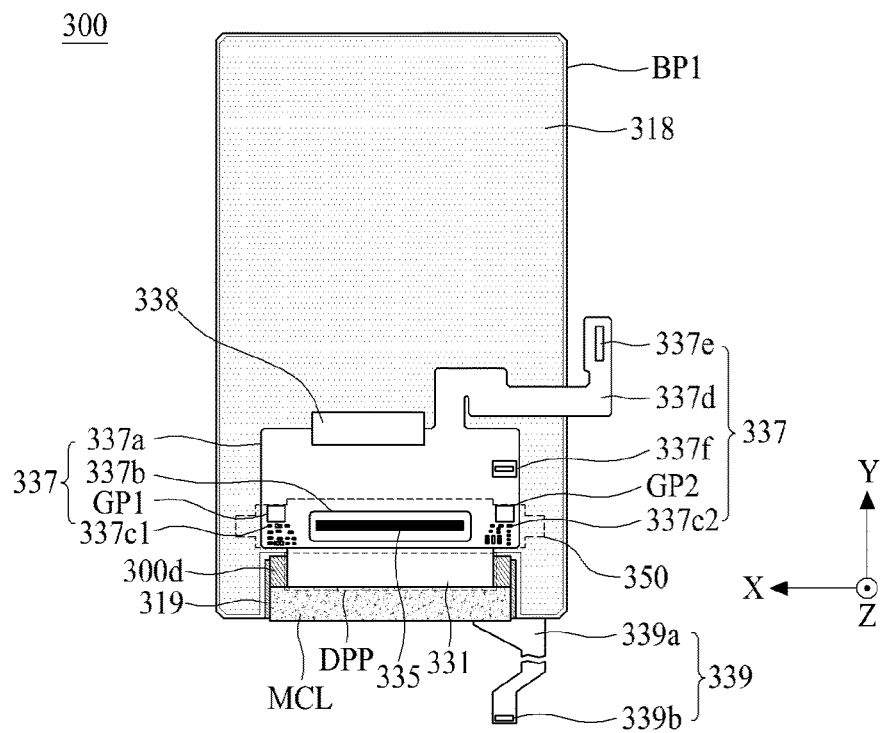
FIG. 5 illustrates a flexible display module obtained by removing a cover member from the flexible display module of FIG. 4 according to one embodiment of the present disclosure.
Figure 6:
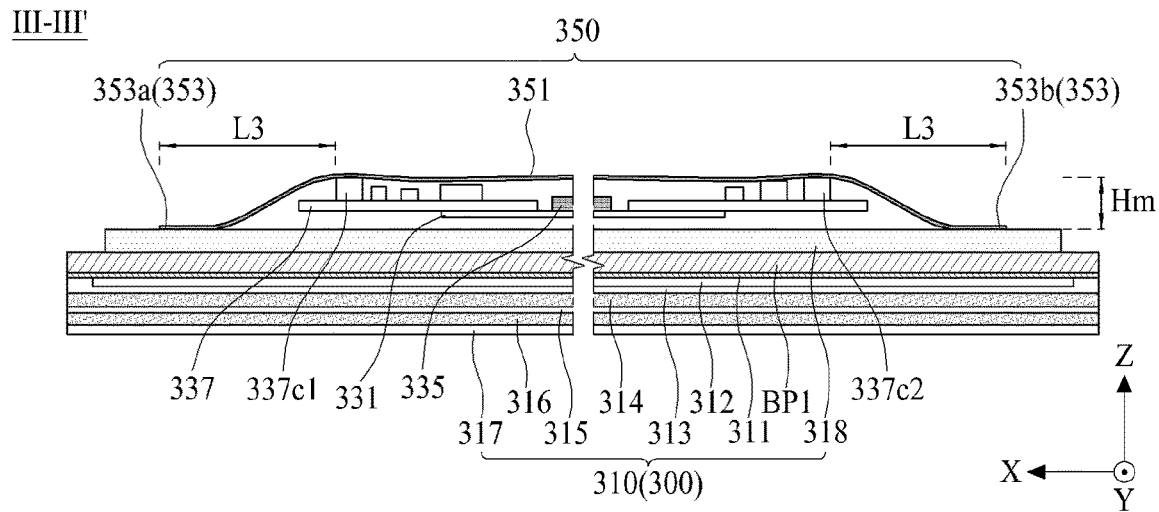
FIG. 6 is a cross sectional view along III-III' of FIG. 4 according to one embodiment of the present disclosure.

FIG. 1 is a plane view illustrating an electronic device according to one embodiment of the present disclosure. FIG. 2 is a cross sectional view along I-I' of FIG. 1. FIG. 3 is a cross sectional view along II-II' of FIG. 1. FIG. 4 illustrates a rear surface of a flexible display module shown in FIG. 3. FIG. 5 illustrates a flexible display module obtained by removing a cover member from the flexible display module of FIG. 4. FIG. 6 is a cross sectional view along III-III' of FIG. 4.

Referring to FIGS. 1 to 6, the electronic device according to one embodiment of the present disclosure may include a cover window 100, a flexible display module 300, and a housing 500. Herein, a scale in each of the cover window 100, the flexible display module 300, and the housing 500 shown in FIGS. 1 to 3 may be different from a real scale, for convenience of explanation, whereby it is not limited to the scale shown in the drawings.

The cover window 100 covers front and lateral surfaces of the flexible display module 300, whereby the cover window 100 protects the flexible display module 300 from an external shock.

The cover window 100 according to one embodiment of the present disclosure may be formed of a transparent plastic material, a glass material, or a tempered glass material. For example, the cover window 100 may be formed of sapphire glass or gorilla glass, or may be formed in a deposition structure of sapphire glass and gorilla glass. According to another example, the cover window 100 may include any one material among PET (polyethyleneterephthalate), PC (polycarbonate), PES (polyethersulfone), PEN (polyethylenapthanate), and PNB (polynorborneen). In consideration of scratch and transparency, the cover window 100 may be formed of tempered glass.

The cover window 100 according to one embodiment of the present disclosure may include a front portion 110, and a sidewall portion 130 which is bent from the edge of the front portion 110.

The front portion 110 corresponds to a central portion of the cover window 100, wherein the front portion 110 may be a transparent portion through which light passes. The front portion 110 may be flat. The front portion 110 may be expressed as a front window.

The sidewall portion 130 may be bent in a curved-line shape with a predetermined radius of curvature from the edge of the front portion 110. For example, the sidewall portion 130 may include a first sidewall which is bent from the first edge (or left edge) of the front portion 110, a second sidewall which is bent from the second edge (or right edge) of the front portion 110, a third sidewall which is bent from the third edge (or upper edge) of the front portion 110, a fourth sidewall which is bent from the fourth edge (or lower edge) of the front portion 110, and a rounding portion connected between each of the first to fourth sidewalls. Accordingly, each edge of the front portion 110 may have a wholly-curved structure by the sidewall portion 130. The sidewall portion 130 may be expressed as a lateral window or lateral curved window.

Accordingly, as the cover window 100 has a wholly-curved 4-side bending structure, it is possible to realize a good design in the electronic device, and to reduce a bezel width in each of horizontal and vertical directions of the electronic device.

Additionally, the cover window 100 may further include a design layer (or decoration layer) prepared in the edge. The design layer is printed at least one time on the edge of a rear surface (or back surface) of the cover window 100 confronting the flexible display module 300 so that it is possible to cover a non-display area on which an image is not displayed in the electronic device.

Selectively, the cover window 100 according to one embodiment of the present disclosure may be formed in a plate shape comprising only the front portion 110. In this case, the aforementioned sidewall portion 130 is omitted.

The flexible display module 300 may be a flexible display module of a flat display device. For the following description of the present disclosure, it is assumed that the flexible display module 300 is a flexible light emitting display module.

The flexible display module 300 is connected with the rear surface (or back surface) of the cover window 100 so that it is possible to display an image and/or to sense a user's touch. The flexible display module 300 may be bonded to a rear surface of the front portion 110 of the cover window 100 by a direct bonding process using a module bonding member 200. Herein, the module bending member 200 may include pressure sensitive adhesive (PSA), optical clear adhesive (OCA), or optical clear resin (OCR). The module bonding member 200 may be expressed as a transparent adhesive member.

The flexible display module 300 according to one embodiment of the present disclosure may include a display portion 300a, a first bending display portion 300b, and a second bending display portion 300c.

The display portion 300a enables to display an image on the front portion 110 of the cover window 100. The first bending display portion 300b, which is bent in shape of curved surface from the first edge of the display portion 300a, enables an image to be displayed on the curved surface of the first sidewall in the sidewall portion 130 of the cover window 100. The second bending display portion 300c, which is bent in shape of curved surface from the second edge of the display portion 300a, enables an image to be displayed on the curved surface of the second sidewall in the sidewall portion 130 of the cover window 100. Selectively, it is possible to omit the first bending display portion 300b and the second bending display portion 300c. In this case, the display portion 300a of the flexible display module 300 is overlapped with the front portion 110 of the cover window 100, however, may be not overlapped with the sidewall portion 130.

The flexible display module 300 according to one embodiment of the present disclosure may include a flexible display panel 310 including the display portion 300a and a display pad portion (DPP), a display driving circuit portion 330 having a flexible circuit board 337 connected with the display pad portion (DPP) and disposed in a rear surface of the flexible display panel 310, and a cover member 350 attached to the rear surface of the flexible display panel 310 and configured to restrain an uneven surface portion (separated portion) of the flexible circuit board 337.

The flexible display panel 310 may display an image on each of the display portion 300a, the first bending display portion 300b, and the second bending display portion 300c, or may display an image only on the display portion 300a. The flexible display panel 310 according to one embodiment of the present disclosure may include a flexible substrate 311, a pixel array 312, a gate driving circuit, the display pad portion (DPP), an encapsulation portion 313, a touch electrode portion 315, a touch pad portion (TPP), a functional film 317, a first back plate (BP1), a second back plate (BP2), a conductive heat-emission portion 318, and a bending maintenance member 319.

The flexible substrate 311 may be defined as a base substrate of the flexible display panel 310. The flexible substrate 311 according to one embodiment of the present disclosure may include a plastic material with flexibility, for example, opaque or colored polyimide (PI). The flexible substrate 311 according to another embodiment of the present disclosure may be formed in a thin film of a glass material having flexibility.

The pixel array 312 according to one embodiment of the present disclosure is formed on the display portion 300a, the first bending display portion 300b, the second bending display portion 300c defined in the flexible substrate 311, whereby an image may be displayed on each of the display portion 300a, the first bending display portion 300b, and the second bending display portion 300c.

The pixel array 312 may include a plurality of pixels which are prepared in a pixel area defined by signal lines on the flexible substrate 311, and are configured to display an image in accordance with a signal supplied to the signal lines. The signal lines may include a gate line, a data line, and a pixel driving power source line.

Each of the plurality of pixels may include a pixel circuit layer comprising a driving thin film transistor prepared in the pixel area, an anode electrode electrically connected with the driving thin film transistor, an emission device layer formed on the anode electrode, and a cathode electrode electrically connected with the emission device layer.

The driving thin film transistor is prepared in a transistor area of each pixel area defined on the flexible substrate 311, and the driving thin film transistor may include a gate electrode, a gate insulating film, a semiconductor layer, a source electrode, and a drain electrode. Herein, the semiconductor layer of the thin film transistor may include silicon of a-Si, poly-Si, or low-temperature poly-si, or may include an oxide such as Indium-Gallium-Zinc-Oxide (IGZO).

The anode electrode is prepared as a pattern shape in an opening area defined in each pixel area, and is electrically connected with the driving thin film transistor.

The emission device layer according to one embodiment of the present disclosure may include an organic light emitting device formed on the anode electrode. The organic light emitting device may be configured to emit the same colored light by each pixel, for example, white colored light by each pixel, or may be configured to emit the different colored light by each pixel, for example, red colored light, green colored light, or blue colored light by each pixel.

The emission device layer according to one embodiment of the present disclosure may include a micro light emitting diode device electrically connected with the anode electrode and the cathode electrode. The micro light emitting diode device may be a light emitting diode realized in an integrated circuit (IC) or chip (Chip), wherein the micro light emitting diode device may include a first terminal electrically connected with the anode electrode, and a second terminal electrically connected with the cathode electrode.

The cathode electrode may be connected with an emission device of the emission device layer prepared for each pixel area in common.

The gate driving circuit may be formed in the first edge and/or second edge of the flexible substrate 311, so that the gate driving circuit may be connected with one end and/or the other end in each gate signal line prepared on the flexible substrate 311. The gate driving circuit may generate a gate signal in response to a gate control signal supplied through the display pad portion (DPP), and may supply the generated gate signal to each of the plurality of gate lines. The gate driving circuit may be a gate embedded circuit formed for a process of manufacturing the thin film transistor of the pixel, but not limited to this type.

The display pad portion (DPP) may include a plurality of pad electrodes prepared at one edge of the flexible substrate 311 which is apart from one side of the pixel array 312. Each of the plurality of pad electrodes may be electrically connected with the gate driving circuit and the signal line of the pixel array 312 through a link line disposed in a panel bending area 300d between the display pad portion (DPP) and one side of the pixel array 312.

The encapsulation portion 313 is formed on the flexible substrate 311 while being configured to surround the pixel array 312, so that it is possible to prevent oxygen or moisture from being permeated into the emission device layer of the pixel array 312. The encapsulation portion 313 according to one embodiment of the present disclosure may be formed in a multi-layered structure obtained by alternately depositing an organic material layer and an inorganic material layer. Herein, the inorganic material layer prevents oxygen or moisture from being permeated into the emission device layer of the pixel array 312. And, the organic material layer may be formed in a relatively large thickness in comparison to the inorganic material layer so that the organic material layer may cover particles which might be generated for a manufacturing process. For example, the encapsulation portion 313 may include a first inorganic film, an organic film on the first inorganic film, and a second inorganic film on the organic film. In this case, the organic film may be defined as a particle cover layer.

The touch electrode portion 315 is disposed on the encapsulation portion 313, wherein the touch electrode portion 315 serves as a touch sensor capable of sensing a user's touch on the cover window 100.

The touch electrode portion 315 according to one embodiment of the present disclosure may include a touch electrode layer disposed on the encapsulation portion 313 overlapped with the pixel array 312, and a dielectric layer configured to cover the touch electrode layer. Selectively, the touch electrode portion 315 may be provided on a touch buffer layer configured to cover the encapsulation portion 313. For example, the touch electrode layer may include a plurality of touch driving electrodes disposed at fixed intervals on the encapsulation portion 313 overlapped with the pixel array 312, and a plurality of touch sensing electrodes electrically insulated from the touch driving electrodes. The touch sensing electrodes may be disposed in the same layer as the touch driving electrodes, or may be displayed in the different layer from the touch driving electrodes with the dielectric layer interposed in-between.

The touch electrode portion 315 according to another embodiment of the present disclosure may be substituted by a capacitive touch panel generally known to those in the art. In this case, the touch panel may be attached onto the encapsulation portion 313 by the use of transparent adhesive member 314. Herein, the transparent adhesive member 314 may include pressure sensitive adhesive (PSA), optical clear adhesive (OCA), or optical clear resin (OCR).

The touch pad portion (TPP) according to one embodiment of the present disclosure may include a plurality of touch pad electrodes which are disposed in one edge of the touch electrode portion 315 provided in one edge (or upper edge) of the flexible substrate 311 and are electrically connected with the touch electrode portion 315. The plurality of touch pad electrodes may be connected with the touch sensing electrodes and touch driving electrodes through a plurality of touch routing lines in one-to-one correspondence. The touch pad portion (TPP) may be overlapped with the link line disposed on the flexible substrate 311.

The touch pad portion (TPP) according to another embodiment of the present disclosure may be disposed in the other edge of the touch electrode portion 315 provided in the other edge of the flexible substrate 311, and may be connected with the touch sensing electrodes and touch driving electrodes through the plurality of touch routing lines in one-to-one correspondence.

If the touch electrode portion 315 is substituted by the touch panel, the touch pad portion (TPP) may be disposed in one edge of the touch panel or the other edge of the touch panel, and may be connected with the touch sensing electrodes and touch driving electrodes through the plurality of touch routing lines in one-to-one correspondence.

The functional film 317 is attached onto the touch electrode portion 315 by the use of film adhesive member 316, and may be attached to the rear surface (or back surface) of the cover window 100 by the use of module bonding member 200. Herein, the film adhesive member 316 may include pressure sensitive adhesive (PSA), optical clear adhesive (OCA), or optical clear resin (OCR).

The functional film 317 according to one embodiment of the present disclosure may include a reflection preventing layer (or reflection preventing film) configured to prevent a reflection of ambient light to improve contrast ratio and outdoor visibility for an image displayed on the flexible display panel 310. For example, the functional film 317 may include a circular polarizing layer (or circular polarizing film) configured to prevent ambient light being incident through the cover window 100 from being reflected on the thin film transistor and/or lines disposed in the pixel array 312 and being advanced toward the cover window 100.

The functional film 317 may further include a barrier layer (or barrier film) configured to firstly prevent a permeation of moisture or oxygen, wherein the barrier layer may be formed of a material with low moisture permeation, for example, polymer.

Also, the functional film 317 may further include a light path control layer (or light path control film) configured to control a path of light emitted from the pixel array 312 to the cover window 100. The light path control layer may have a deposition structure obtained by alternately depositing a high refraction layer and a low refraction layer, whereby a path of light being provided from the pixel array 312 may be changed, to thereby minimize a color shift in accordance with a viewing angle.

Selectively, the functional film 317 may be disposed between the touch electrode portion 315 and the encapsulation portion 313. In this case, the touch electrode portion 315 may be attached to the cover window 100 by the use of module bonding member 200.

The first back plate (BP1) is attached to the rear surface (or back surface) of the flexible substrate 311 being overlapped with the pixel array 312, whereby the rear surface (or back surface) of the flexible substrate 311 being overlapped with the pixel array 312 is maintained in a plane state.

The second back plate (BP2) is attached to one edge of the rear surface (or back surface) of the flexible substrate 311 being overlapped with the display pad portion (DPP), whereby the one edge of the rear surface (or back surface) of the flexible substrate 311 is maintained in a plane state.

A link line area of the flexible substrate 311, which is provided with link lines while being overlapped with an open portion between the first back plate (BP1) and the second back plate (BP2), may be defined as the panel bending area 300d which is bent with a predetermined radius of curvature. That is, the panel bending area 300d of the flexible substrate 311 is not supported in a plane state by the first back plate (BP1) and the second back plate (BP2), whereby the panel bending area 300d of the flexible substrate 311 may be freely bent. Accordingly, the panel bending area 300d of the flexible substrate 311 is bent to surround one lateral surface of the first back plate (BP1) confronting the second back plate (BP2), whereby the display pad portion (DPP) may be overlapped with one rear edge of the first back plate (BP1). Thus, the flexible display module 300 is bent to provide a predetermined radius of curvature in the panel bending area 300d of the flexible substrate 311, to thereby realize a small bezel width.

The conductive heat-emission portion 318 may be attached to the rear surface (or back surface) of the first back plate (BP1). The conductive heat-emission portion 318 protects the flexible display panel 310 from a shock, and radiates heat of the flexible display panel 310. The conductive heat-emission portion 318 may be expressed as a heat-emission tape, a heat-emission cushion tape, a conductive heat-emission tape, a heat-emission sheet, a heat-emission ground sheet, or a conductive heat-emission sheet.

The conductive heat-emission portion 318 according to one embodiment of the present disclosure may include a heat-emission member 318a, a cushion member 318b, and an adhesive member 318c.

The heat-emission member 318a may include a heat-emission layer having a metal material with a relatively high thermal conductivity. The heat-emission member 318a according to one embodiment of the present disclosure may include a metal layer of copper (Cu). The heat-emission member 318a according to another embodiment of the present disclosure may include a metal layer of copper (Cu), and a graphite layer coated onto the metal layer. The heat-emission member 318a may provide a heat-emission function, a ground function, and a protection function for protecting the rear surface of the flexible display panel 310.

The cushion member 318b may include a foam tape or foam pad connected with a front surface of the heat-emission member 318a. The cushion member 318b may absorb a shock.

The adhesive member 318c may be connected with a front surface of the cushion member 318b. The adhesive member 318c may include an uneven surface structure (or embossing structure) formed in its surface. The uneven surface structure of the adhesive member 318c prevents bubbles from being generated between the first back plate (BP1) and the conductive heat-emission member 318 for an attachment process between the first back plate (BP1) and the conductive heat-emission portion 318 so that it is possible to omit a deformation process for removing bubbles generated between the first back plate (BP1) and the conductive heat-emission portion 318.

The bending maintenance member 319 may be disposed between the first back plate (BP1) and the second back plate (BP2) being overlapped with each other with respect to a thickness direction (Z) of the flexible display panel 310. The bending maintenance member 319 fixes the second back plate (BP2) disposed in the rear surface of the first back plate (BP1) to one rear edge of the first back plate (BP1) in accordance with the bending of the flexible substrate 311 so that it is possible to maintain the bending state and bending shape of the flexible substrate 311.

One surface (or front surface) of the bending maintenance member 319 may be attached to the heat-emission layer 318a of the conductive heat-emission portion 318, or may be attached to the first back plate (BP1) from which some portions of the conductive heat-emission portion 318 are removed. And, the other surface (or rear surface) of the bending maintenance member 319 may be attached to the second back plate (BP2).

If one surface of the bending maintenance member 319 is directly attached to the first back plate (BP1), a thickness of the flexible display panel 310 may be reduced. And, if one surface of the bending maintenance member 319 is directly attached to the heat-emission member 318a of the conductive heat-emission portion 318, it is possible to reduce a bending repulsive force by the panel bending area 300d of the flexible substrate 311 which is bent by the increased distance between the first back plate (BP1) and the second back plate (BP2).

The bending maintenance member 319 according to one embodiment of the present disclosure may include a bar-shaped metal material structure, a plastic-material structure, or a double-sided tape. Selectively, the bending maintenance member 319 according to one embodiment of the present disclosure may include a bending guide portion 319a which is protruding toward the panel bending area 300d of the flexible substrate 311. An outer lateral surface of the bending guide portion 319a may have a curved-line shape which enables to bend the panel bending area 300d of the flexible substrate 311 in a curved-line shape.

The flexible display panel 310 according to one embodiment of the present disclosure may further include a micro cover layer (MCL, or cover layer) for covering the panel bending area 300d of the flexible substrate 311.

The micro cover layer (MCL) may cover the panel bending area 300*d* of the flexible substrate 311 disposed between the encapsulation portion 313 and the display pad portion (DPP).

The micro cover layer (MCL) may include a polymer material, wherein the micro cover layer (MCL) may be coated on to the panel bending area 300*d* of the flexible substrate 311 to cover the link line between the encapsulation portion 313 and the display pad portion (DPP). The micro cover layer (MCL) protects the link line from an external shock, and also prevents moisture permeation into the link line. Especially, when the panel bending area 300*d* of the flexible substrate 311 is bent in a curved-line shape with a predetermined radius of curvature, the micro cover layer (MCL) is provided to position the link line on a neutral plane. That is, when the panel bending area 300*d* of the flexible substrate 311 is bent with a predetermined radius of curvature, the neutral plane, in which each of a tensile force and a compressive force becomes '0' (zero), exists between the flexible substrate 311 and the micro cover layer (MCL). Accordingly, the micro cover layer (MCL) may include a material whose elastic coefficient is relatively higher than that of the flexible substrate 311 so that the link lines may be positioned in the neutral plane. Thus, the link lines are positioned in the neutral plane between the micro cover layer (MCL) and the flexible substrate 311. That is, when the panel bending area 300*d* of the flexible substrate 311 is bent in a curved-line shape, a bending stress of '0' is applied to the link lines positioned in the neutral line between the micro cover layer (MCL) and the flexible substrate 311, whereby the link lines may be bent without any damage caused by the bending stress.

The display driving circuit portion 330 may be connected with the display pad portion (DPP) of the flexible display panel 310, whereby the display driving circuit portion 330 may be disposed in the rear surface of the flexible display panel 310. The display driving circuit portion 330 may display an image on the pixel array 312 of the flexible display panel 310, and may sense a user's touch through the touch electrode portion 315 of the flexible display panel 310.

The display driving circuit portion 330 according to one embodiment of the present disclosure may include a panel flexible circuit film 331, a driving integrated circuit 335, a flexible circuit board 337, and a touch flexible circuit film 339.

The panel flexible circuit film 331 may be electrically connected with the display pad portion (DPP) prepared in the flexible substrate 311 while being disposed in the rear surface of the flexible display panel 310. The panel flexible circuit film 331 may be attached to the display pad portion (DPP) prepared in the flexible substrate 311 through the use of film attachment process using an anisotropic conductive film. For example, the panel flexible circuit film 331 may be a chip on film.

The driving integrated circuit 335 may be mounted on the panel flexible circuit film 331 disposed in the rear surface of the flexible display panel 310. The driving integrated circuit 335 according to one embodiment of the present disclosure may be mounted on the panel flexible circuit film 331 by a chip bonding process or surface mounting process. The driving integrated circuit 335 may generate a data signal and a gate control signal on the basis of timing synchronized signal and video data supplied from an external host driving system (or host driving circuit), may supply the data signal to the data line of each pixel through the display pad portion (DPP), and may supply the gate control signal to the gate driving circuit. The driving integrated circuit 355 may be disposed in the rear surface of the flexible display panel 310.

Selectively, the driving integrated circuit 335 is not mounted on the panel flexible circuit film 331, and is mounted (or bounded onto) on a chip mounting area defined in the flexible substrate 311, whereby the driving integrated circuit 335 may be electrically connected with the display pad portion (DPP), and may be connected with the signal line in each of the pixel array 312 and the gate driving circuit disposed on the flexible substrate 311. In this case, the panel flexible circuit film 331 may relay a signal transport between the display pad portion (DPP) and the host driving system, or may be omitted.

The flexible circuit board 337 may be electrically connected with the panel flexible circuit film 331 in the rear surface of the flexible display panel 310. The flexible circuit board 337 according to one embodiment of the present disclosure may be electrically connected with a pad electrode portion prepared in the panel flexible circuit film 331 by a film attachment process using an anisotropic conductive film, and may be overlapped with the first back plate (BP1) of the flexible display panel 310. The flexible circuit board 337 may provide the timing synchronized signal and video data, supplied from the host driving system, to the driving integrated circuit 335 through the display pad portion (DPP), and may provide voltages which are necessary for driving the pixel array 312, the gate driving circuit, and the driving integrated circuit 335. The flexible circuit board 337 may be expressed as a main flexible printed circuit board or a display driving circuit board.

The flexible circuit board 337 according to one embodiment of the present disclosure may include a circuit body portion 337*a*, a board opening portion 337*b*, first circuit components 337*c*1, second circuit components 337*c*2, an extension line portion 337*d*, and a board connector 337*e*.

The circuit body portion 337*a* may be electrically connected with the pad electrode portion prepared in the panel flexible circuit film 331. The circuit body portion 337*a* may include a board pad portion (BPP) disposed in one surface confronting the conductive heat-emission portion 318. The board pad portion (BPP) may be electrically connected with the pad electrode portion prepared in the panel flexible circuit film 331 by a film attachment process using an anisotropic conductive film. For example, the circuit body portion 337*a* may have a rectangular shape.

The other edge of the circuit body portion 337*a* may be fixed to the conductive heat-emission portion 318 by the use of adhesive tape 338. In this case, one side of the adhesive tape 338 may be adhered to the other edge of the circuit body portion 337*a*, and the other side of the adhesive tape 338 may be adhered to the conductive heat-emission portion 318. Selectively, the adhesive tape 338 may electrically connect a ground terminal prepared in the circuit body portion 337*a* with the conductive heat-emission portion 318. In this case, the adhesive tape 338 may be a conductive tape comprising a conductive layer being in electric-contact with each of the conductive heat-emission portion 318 and the ground terminal prepared in the circuit body portion 337*a*.

The board opening portion 337*b* may be provided in the circuit body portion 337*a* while being adjacent to the board pad portion (BPP). For example, the board opening portion 337*b* may penetrate through the circuit body portion 337*a* and may have a size enabling an insertion of the driving integrated circuit 335 mounted on the panel flexible circuit film 331. The board opening portion 337*b* may be expressed as a direct circuit insertion hole. Thus, in case of this present disclosure, the driving integrated circuit 335 is inserted into the board opening portion 337b, whereby the flexible circuit board 337 and the driving integrated circuit 335 are disposed while being overlapped with each other, to thereby reduce an occupying area of the display driving circuit portion 330 in the flexible display module 300, and furthermore, to reduce a thickness of the flexible display module 300.

Selectively, it is possible to omit the board opening portion 337b from the electronic device in accordance with a circuit arrangement space prepared in the rear surface of the flexible display module 300. Also, the board pad portion (BPP) may be disposed in one edge of the circuit body portion 337a being adjacent to the panel flexible circuit film 331. In this case, the driving integrated circuit 335 may be mounted on the panel flexible circuit film 331 which is not overlapped with the flexible circuit board 337. For example, the driving integrated circuit 335 may be mounted on the panel flexible circuit film 331 disposed between the end of the flexible substrate 311 and the flexible circuit board 337.

The first circuit components 337c1 may be mounted on the first edge area (or left edge area) of the circuit body portion 337a with respect to a first direction (X). For example, the first circuit components 337c1 may be mounted on the first edge area of the circuit body portion 337a being adjacent to one side of the board opening portion 337b. The first circuit components 337c1 according to one embodiment of the present disclosure may include at least one among a resistor, a capacitor, an inductor, and an integrated circuit.

The second circuit components 337c2 may be mounted on the second edge area (or right edge area) of the circuit body portion 337a with respect to the first direction (X). For example, the second circuit components 337c2 may be mounted on the second edge area of the circuit body portion 337a being adjacent to the other side of the board opening portion 337b. The second circuit components 337c2 according to one embodiment of the present disclosure may include at least one among a resistor, a capacitor, an inductor, and an integrated circuit.

The extension line portion 337d may extend by a predetermined length from the other edge of the circuit body portion 337a. For example, the extension line portion 337d may have a linear shape or non-linear shape. The length and shape of the extension line portion 337d may be set in accordance with a position of the host driving system (or host driving board) disposed in the rear surface of the flexible display module 300.

The board connector 337e may be provided in the end of the extension line portion 337d and may be electrically connected with the host driving system.

The flexible circuit board 337 according to one embodiment of the present disclosure may further include at least one first ground pad (GP1) disposed in the circuit body portion 337a, and at least one second group pad (GP2) disposed in the circuit body portion 337a.

The at least one first ground pad (GP1) may be prepared in the first edge area of the circuit body portion 337a while being adjacent to the first circuit components 337c1. The at least one first ground pad (GP1) may be electrically connected with the conductive heat-emission portion 318 through the cover member 350.

The at least one second ground pad (GP2) may be prepared in the second edge area of the circuit body portion 337a while being adjacent to the second circuit components 337c2. The at least one second ground pad (GP2) may be electrically connected with the conductive heat-emission portion 318 through the cover member 350.

The flexible circuit board 337 according to one embodiment of the present disclosure may further include a touch connector 337f. The touch connector 337f may be mounted on the circuit body portion 337a, and may be electrically connected with the touch flexible circuit 339.

The touch flexible circuit film 339 may be electrically connected with the touch pad portion (TPP) prepared in the flexible display panel 310 by a film attachment process using an anisotropic conductive film, and may be electrically connected with the touch connector 337f mounted on the flexible circuit board 337. The touch flexible circuit film 339 may supply a touch driving signal, which is provided from the flexible circuit board 337, to the touch electrodes through the touch pad portion (TPP), and may supply a signal corresponding to a capacitance change in the touch electrodes to the flexible circuit board 337 through the touch pad portion (TPP).

The touch flexible circuit film 339 according to one embodiment of the present disclosure may include a touch bonding portion attached to the touch pad portion (TPP), a touch connector terminal 339b connected with the touch connector 337f of the flexible circuit board 337, a film bending portion 339a between the touch bonding portion and the touch connector terminal 339b, and a circuit portion between the film bending portion 339a and the touch connector terminal 339b. The film bending portion 339a may be bent in a curved-line shape to surround the panel bending area 300d of the flexible substrate 311. In this case, the touch flexible circuit film 339 may have uneven surface portions caused by a bending repulsive force of the film bending portion 339a. In order to prevent the uneven surface portions of the touch flexible circuit film 339, at least some portions of the film bending portion 339a may have a relatively smaller thickness in comparison to that of the circuit portion.

Selectively, the touch flexible circuit film 339 may be connected with the host driving system instead of the touch connector 337f of the flexible circuit board 337. In this case, it is possible to omit the touch connector 337f mounted on the flexible circuit board 337.

The cover member 350 may be attached to the rear surface of the flexible display panel 310 while being overlapped with the flexible circuit board 337. The cover member 350 according to one embodiment of the present disclosure is attached to the conductive heat-emission member 318 of the flexible display panel 310 while being disposed on one edge of the flexible circuit board 337, whereby the cover member 350 may cover all the board opening portion 337b, the first circuit components 337c1, the second circuit components 337c2, the first ground pad (GP1), and the second ground pad (GP2) of the flexible circuit board 337, and also may cover the driving integrated circuit 335 inserted into the board opening portion 337b of the flexible circuit board 337. The cover member 350 may prevent or restrict the uneven surface portions of the flexible circuit board 337 or a thermal deformation of the flexible circuit board 337. Also, the cover member 350 may cover the driving integrated circuit 335 mounted on the panel flexible circuit film 331 or the flexible substrate 311 so that it is possible to protect the driving integrated circuit 335 from a shock or to prevent a direct contact between the driving integrated circuit 335 and other structures. And, the cover member 350 may electrically connect each of the first and second ground pads (GP1, GP2) prepared in the flexible circuit board 337 to the conductive heat-emission member 318.

The housing 500 may receive the flexible display panel 300, and may support the cover window 100. For example, the housing 500 may be connected with the sidewall portion 130 of the cover window 100, to thereby support the cover window 100.

The housing 500 according to one embodiment of the present disclosure may further include a rear housing 510 configured to cover the rear surface of the flexible display module 300 under the condition that a circuit receiving space 501 is interposed in-between, and a lateral housing 530 configured to support the cover window 100.

The rear housing 510 is disposed in the outermost rear surface of the electronic device, wherein the rear housing 510 may include a plastic material, a metal material, or a glass material. For example, the rear housing 510 may include a glass material with a color coating layer.

The lateral housing 530 according to one embodiment of the present disclosure is disposed in the outermost lateral surface of the electronic device, wherein the lateral housing 530 may be bent from the edge of the rear housing 510 and be connected with the sidewall portion 130 of the cover window 100.

The lateral housing 530 according to another embodiment of the present disclosure may be formed of a plastic material, a metal material, or a glass material, and may be disposed in the edge of the sidewall portion 130 of the cover window 100.

The circuit receiving space 501 is prepared between the rear surface of the flexible display module 300 and the rear housing 510, wherein the host driving system, memory and battery may be received in the circuit receiving space 501.

The electronic device according to one embodiment of the present disclosure may further include a middle frame 700.

The middle frame 700 is disposed in the circuit receiving space 501 of the housing 500, and the middle frame 700 may support circuit components disposed in the circuit receiving space 501. The middle frame 700 may support the cover window 100. The middle frame 700 according to one embodiment of the present disclosure may include a middle plate 710 and a middle sidewall 730.

The middle plate 710, which is disposed between the rear surface of the flexible display module 300 and the rear housing 510, may support the circuit components disposed in the circuit receiving space 501.

The middle sidewall 730, which is vertically connected with a lateral surface of the middle plate 710, may support the sidewall portion 130 of the cover window 100.

Selectively, the lateral housing 530 of the housing 500 may be substituted by the middle sidewall 730 of the middle frame 700. In this case, the middle sidewall 730 of the middle frame 700 may be disposed between the sidewall portion 130 of the cover window 100 and the edge of the rear housing 510, whereby it is possible to omit the lateral housing 530 of the housing 500.

Figure 7:
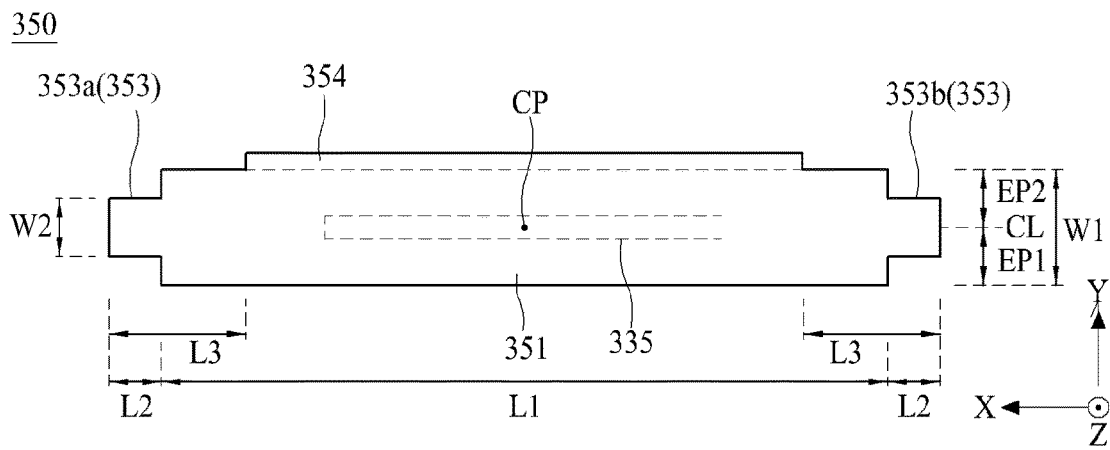
FIG. 7 is a plane view illustrating a cover member according to one embodiment of the present disclosure according to one embodiment of the present disclosure.
Figure 8:
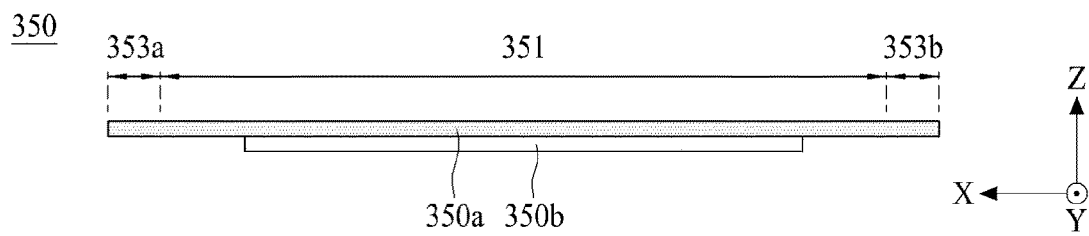
FIG. 8 is a cross sectional view illustrating the cover member of FIG. 7 according to one embodiment of the present disclosure.

FIG. 7 is a plane view illustrating the cover member 350 according to one embodiment of the present disclosure, and FIG. 8 is a cross sectional view illustrating the cover member shown in FIG. 7.

Referring to FIGS. 7 and 8 in connection with FIG. 6, the cover member 350 according to one embodiment of the present disclosure may include a cover body portion 351 and an adhesion portion 353.

The cover body portion 351 may be overlapped with the flexible circuit board 337. The cover body portion 351 according to one embodiment of the present disclosure may be overlapped with one edge of the flexible circuit board 337 being adjacent to the display pad portion (DPP) of the flexible display panel 310. Accordingly, the cover body portion 351 may cover the board opening portion 337b of the flexible circuit board 337, the first and second circuit components 337c1 and 337c2, the first and second ground pads (GP1, GP2), and the driving integrated circuit 335 which is inserted into the board opening portion 337b of the flexible circuit board 337. The cover body portion 351 covers one edge of the flexible circuit board 337, whereby the cover body portion 351 may be expressed as a cover area.

A central portion (CP) of the cover body portion 351 may be overlapped with a central portion of the driving integrated circuit 335, but not limited to this structure. Within an allowance in consideration of a manufacturing process of the cover member 350 and an attachment process of the cover member 350, the central portion (CP) of the cover body portion 351 may be overlapped with the central portion of the driving integrated circuit 335. For example, the central portion (CP) of the cover body portion 351 and the central portion of the driving integrated circuit 335 may be overlapped with each other within a range of ±0.4 mm.

The cover body portion 351 according to one embodiment of the present disclosure may have a first length (L1) which is parallel to a first direction (X, or length direction), and a first width (W1) which is parallel to a second direction (Y, or width direction) being in perpendicular to the first direction (X). The first length (L1) of the cover body portion 351 may be relatively longer than a length of the flexible circuit board 337 being parallel to the first direction (X).

With respect to the first direction (X), the cover body portion 351 may include a middle portion disposed on the flexible circuit board 337, and an edge portion which is inclined between the middle portion and the adhesion portion 353. The middle portion of the cover body portion 351 may be configured to cover one edge of the flexible circuit board 337, and also may be supported by the first and second circuit components 337c1 and 337c2 disposed in one edge of the flexible circuit board 337. The edge portion of the cover body portion 351 may be inclined or bent in a curved-line shape to surround one edge or both edges of the flexible circuit board 337.

With respect to the second direction (Y), the cover body portion 351 may include one edge portion (EP1) disposed in a lower side of a central line (CL), and the other edge portion (EP2) disposed in an upper side of the central line (CL). In this case, in comparison to the other edge portion (EP2), one edge portion (EP1) of the cover body portion 351 may be relatively close to the display pad portion (DPP) of the flexible display panel 310.

The adhesion portion 353 may be connected with both sides (e.g., ends) of the cover body portion 351, and may be attached to the rear surface of the flexible display panel 310. The adhesion portion 353 with a predetermined length and width may protrude (or extend) from both sides of the cover body portion 351, and the adhesion portion 353 may be attached to the conductive heat-emission portion 318 of the flexible display panel 310. The adhesion portion 353 is attached to the conductive heat-emission portion 318, whereby the adhesion portion 353 may be expressed as an attachment area or fixation area.

The adhesion portion 353 according to one embodiment of the present disclosure may include a first adhesion portion 353a and a second adhesion portion 353b.

The first adhesion portion 353a may protrude (or extends) in the first direction (X) from one side (or left side) of the cover body portion 351, and may be attached to the conductive heat-emission portion 318 of the flexible display panel 310. The first adhesion portion 353a according to one embodiment of the present disclosure may protrude from a middle portion (MP) of one side (or left side) of the cover body portion 351, or may protrude from an upper portion (EP) of one side (or left side) of the cover body portion 351. For example, the first adhesion portion 353*a* may have a second length (L2) which is parallel to the first direction (X), and a second width (W2) which is parallel to the second direction (Y).

The second length (L2) of the first adhesion portion 353*a* according to one embodiment of the present disclosure may be set to be 1.5 mm or more than 1.5 mm in consideration of a stable adhesion between the cover member 350 and the conductive heat-emission portion 318.

The second width (W2) of the first adhesion portion 353*a* according to one embodiment of the present disclosure may be smaller than the first width (W1) of the cover body portion 351. For example, the second width (W2) may be ⅓ to ⅔ of the first width (W1).

If the second width (W2) of the first adhesion portion 353*a* is within ⅓ to ⅔ of the first width (W1) of the cover body portion 351, a deforming force (or force causing uneven surface portions) of the cover body portion 351, which is generated in the edge of the cover body portion 351 which is not connected with the first adhesion portion 353*a*, is not transmitted to the first adhesion portion 353*a* or is not directly transmitted to the first adhesion portion 353*a* so that it is possible to prevent or minimize a separation of the first adhesion portion 353*a* by the deforming force of the cover body portion 351. In other words, the deforming force (or force causing uneven surface portions), which is generated in one edge and the other edge of the cover body portion 351 being not connected with the first adhesion portion 353*a*, is not directly transmitted to the first adhesion portion 353*a* or is distributed so that it is possible to prevent the first adhesion portion 353*a* from being separated from the conductive heat-emission portion 318 or to minimize the separation of the first adhesion portion 353 from the conductive heat-emission portion 318.

Meanwhile, if the second width (W2) of the first adhesion portion 353*a* is less than ⅓ of the first width (W1) of the cover body portion 351, an adhesion force between the cover member 350 and the conductive heat-emission portion 318 is lowered due to the decrease on adhesion area between the cover member 350 and the conductive heat-emission portion 318, whereby the first adhesion portion 353*a* may be separated from the conductive heat-emission portion 318 due to the deforming force of the cover body portion 351 by the uneven surface portions of the flexible circuit board 337 or the deforming force of the cover body portion 351 by the thermal deformation of the flexible circuit board 337. And, if the second width (W2) of the first adhesion portion 353*a* is more than ⅔ of the first width (W1) of the cover body portion 351, the deforming force of the cover body portion 351 by the uneven surface portions of the flexible circuit board 337 or the deforming force of the cover body portion 351 by the thermal deformation of the flexible circuit board 337 may be directly transmitted to the first adhesion portion 353*a*, whereby the first adhesion portion 353*a* may be separated from the conductive heat-emission portion 318.

The second adhesion portion 353*b* may protrude (or extends) in the first direction (X) from the other side (or right side) of the cover body portion 351, and may be attached to the conductive heat-emission portion 318 of the flexible display panel 310. The second adhesion portion 353*b* according to one embodiment of the present disclosure may protrude from a middle portion (MP) of the other side (or right side) of the cover body portion 351, or may protrude from an upper portion (EP) of the other side (or right side) of the cover body portion 351. For example, the second adhesion portion 353*b* may have a second length (L2) which is parallel to the first direction (X), and a second width (W2) which is parallel to the second direction (Y). The second adhesion portion 353*b* is identical in structure to the first adhesion portion 353*a*, whereby a detailed description for the second adhesion portion 353*b* will be omitted.

A total length (L3) in the edge portion of the cover body portion 351 and each of the first adhesion portion 353*a* and the second adhesion portion 353*b* may be two times (Hm*2) or more than two times of a maximum length (Hm) between the conductive heat-emission portion 318 and the circuit components 337*c*1 and 337*c*2. Herein, if the total length (L3) in the edge portion of the cover body portion 351 and each of the first adhesion portion 353*a* and the second adhesion portion 353*b* is less than two times (Hm*2) of the maximum length (Hm), the adhesion portion 353 may be separated from the conductive heat-emission portion 318 by the uneven surface portion or deformation of the flexible circuit board 337. Thus, in order to realize stable adhesion and good function of the adhesion portion 353, the total length (L3) in the edge portion of the cover body portion 351 and each of the first adhesion portion 353*a* and the second adhesion portion 353*b* is to be two times or more than two times (Hm*2) of the maximum length (Hm), in one embodiment. Herein, the edge portion of the cover body portion 351 may be defined as a point at which the cover body portion 351 is bent toward the conductive heat-emission portion 318 by a height of the conductive heat-emission portion 318 and the flexible circuit board 337.

The cover member 350 according to one embodiment of the present disclosure may further include a cover protruding portion 354.

The cover protruding portion 354 is protruding from the other side of the cover body portion 351 and is overlapped with the upper periphery of the board opening portion 337*b* of the circuit board 337 so that it is possible to prevent the board opening portion 337*b* of the flexible circuit board 337 from being exposed by an attachment process error of the cover member 350.

The cover member 350 according to one embodiment of the present disclosure may include a conductive tape 350*a* and an insulating tape 350*b*.

The conductive tape 350*a* may include the cover body portion 351 and the adhesion portion 353. For example, the conductive tape 350*a* may include a base film, a metal layer attached to a rear surface of the base film by the use of adhesion layer, and a conductive adhesion layer formed on a rear surface of the metal layer.

The insulating tape 350*b* may be configured to include the cover body portion 351 and may be attached to a rear surface of the conductive tape 350*a*. For example, the insulating tape 350*b* may be attached to the remaining portions except the portions, which are overlapped with the first and second ground pads (GP1, GP2) prepared in the flexible circuit board 337, in the cover body portion 351 of the insulating tape 350*a*. The insulating tape 350*b* is disposed in the cover body portion 351 of the conductive tape 350*a*, whereby the metal layer disposed in the cover body portion 351 of the conductive tape 350*a* is electrically insulated from the circuit components 337*c*1 and 337*c*2 mounted on the flexible circuit board 337.

Since the insulating tape 350*b* is not attached to the metal layer disposed in the adhesion portion 353 of the conductive tape 350*a*, the metal layer disposed in the adhesion portion 353 of the conductive tape 350*a* may be electrically connected with the conductive heat-emission portion 318 by the use of conductive adhesion layer. And, as the insulating tape 350*b* is not attached to some of the metal layer disposed in the first and second edges of the cover body portion 351 of the conductive tape 350*a*, some of the metal layer disposed in the first and second edges of the cover body portion 351 of the conductive tape 350*a* may be electrically connected with each of the first and second ground pads (GP1, GP2) prepared in the flexible circuit board 337 through the use of conductive adhesion layer, whereby each of the first and second ground pads (GP1, GP2) of the flexible circuit board 337 may be electrically connected with the conductive heat-emission portion 318 through the conductive tape 350*a* disposed in each of the adhesion portion 353 and the cover body portion 351 of the cover member 350.

The cover member 350 according to one embodiment of the present disclosure includes the adhesion portion 353 which is connected with both sides of the cover body portion 351 while being configured to have the second width (W2) which is relatively smaller than the first width (W1) of the cover body portion 351 overlapped with the flexible circuit board 337, and then attached to the rear surface of the flexible display panel 310, whereby it is possible to prevent or minimize the separation of the first adhesion portion 353*a* by the deforming force (or force causing uneven surface portions) of the cover body portion 351. Thus, according to the present disclosure, the uneven surface portions of the flexible circuit board 337 may be prevented or restricted through the use of cover member 350, the circuit components 337*c*1 and 337*c*2 mounted on the flexible circuit board 337 may be protected, and the ground pads (GP1, GP2) prepared in the flexible circuit board 337 may be grounded to the conductive heat-emission portion 318 disposed in the rear surface of the flexible display panel 310.

Figure 9:
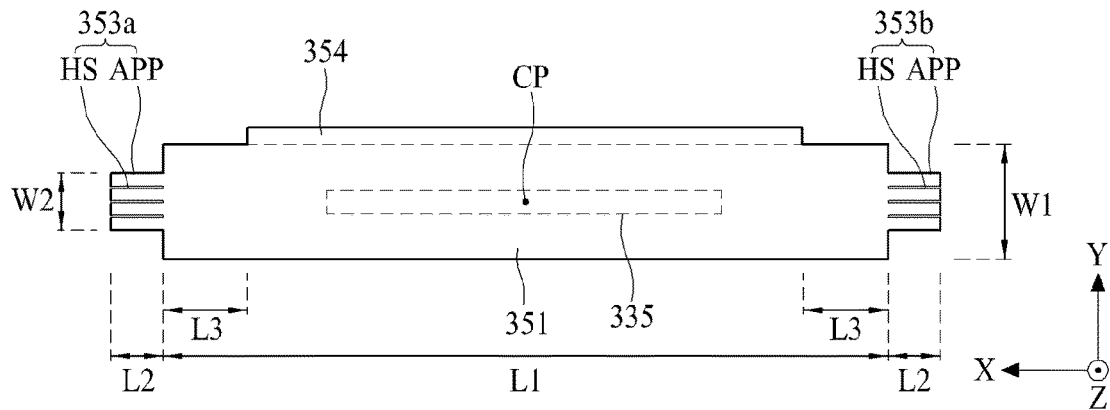
FIG. 9 is a plane view illustrating a cover member according to another embodiment of the present disclosure.

FIG. 9 is a plane view illustrating a cover member according to another embodiment of the present disclosure, which is obtained by providing an adhesion member comprising a plurality of protrusions in the cover member of FIGS. 7 and 8. Hereinafter, the reference numbers will be used throughout the drawings to refer to the same remaining elements except an adhesion member of a cover member and related elements, and a detailed description for the same parts will be omitted.

Referring to FIG. 9 in connection with FIG. 8, each of first and second adhesion portions 353*a* and 353*b* of the cover member 350 according to another embodiment of the present disclosure may include a plurality of adhesion protruding portions (APP), and a plurality horizontal slits (HS), wherein each horizontal slit (HS) is provided between each of the adhesion protruding portions (APP).

Each of the plurality of adhesion protruding portions (APP) may be disposed while being parallel to a first direction (X) with the horizontal slit (HS) interposed in-between.

The horizontal slits (HS) may be disposed along the first direction (X), wherein each horizontal slit (HS) may be disposed between each of the adhesion protruding portions (APP). For example, a length in each of the horizontal slits (HS) which are parallel to the first direction (X) may be the same as a second length (L2) of the adhesion portion 353*a* and 353*b*, but not limited to this structure. The length in each of the horizontal slits (HS) which are parallel to the first direction (X) may be shorter than the second length (L2). The horizontal slits (HS) gradually transmit a deforming force (or force causing uneven surface portions) of a cover body portion 351 to the adhesion portion 353 without a direct transmission of the deforming force so that it is possible to prevent or minimize a separation of the adhesion portion 353 caused by the deforming force (or force causing uneven surface portions) of the cover body portion 351.

The cover member 350 according to another embodiment of the present disclosure may provide the same effect as that of the cover member according to one embodiment of the present disclosure, and also may prevent or minimize the separation of the adhesion portion 353 caused by the deformation or deforming force of the flexible circuit board 337.

Figure 10:
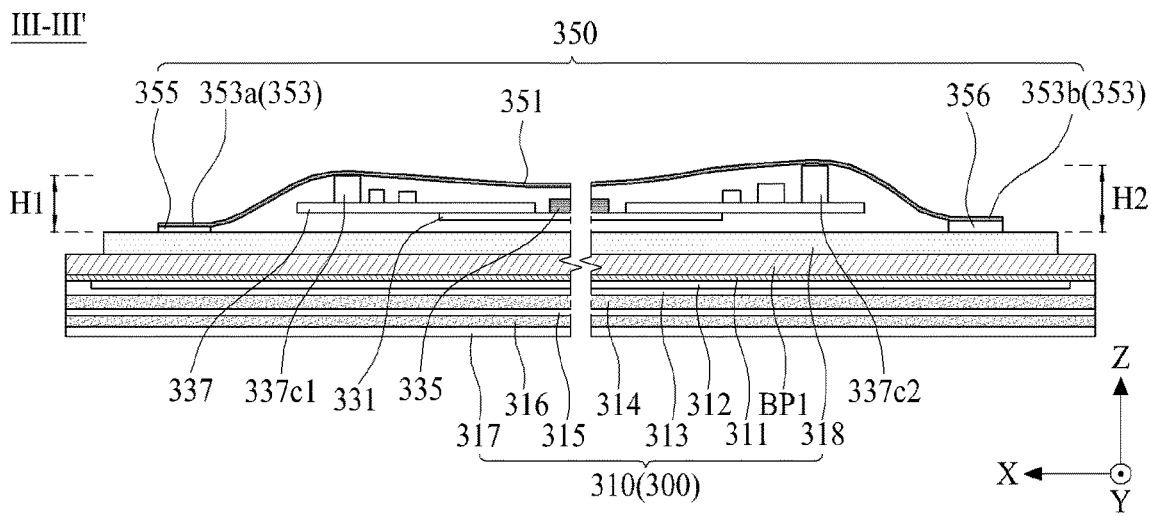
FIG. 10 illustrates a cover member according to another embodiment of the present disclosure.
Figure 11:
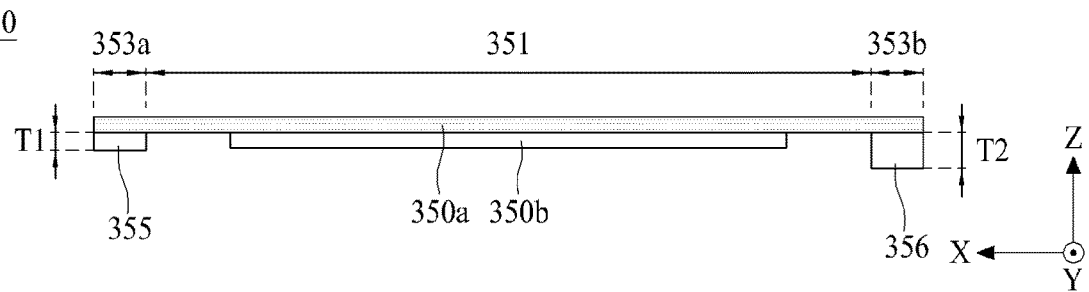
FIG. 11 is a cross sectional view illustrating the cover member of FIG. 10 according to one embodiment of the present disclosure.

FIG. 10 illustrates a cover member according to another embodiment of the present disclosure, and FIG. 11 is a cross sectional view illustrating the cover member shown in FIG. 10, which are obtained by additionally providing a step compensation member to the cover member of FIGS. 3 to 9. Hereinafter, the same reference numbers will be used throughout the drawings to refer to the remaining elements except a step compensation member and related elements, and a detailed description for the same parts will be omitted.

Referring to FIGS. 10 and 11, the cover member 350 according to another embodiment of the present disclosure may further include first and second step compensation members 355 and 356.

First, a height in first circuit components 337*c*1 disposed in a first edge of a flexible circuit board 337 may be different from a height in second circuit components 337*c*2 disposed in a second edge of the flexible circuit board 337. In this case, any one of first and second adhesion portions 353*a* and 353*b* of the cover member 350 may be separated from a conductive heat-emission portion 318. For example, a maximum height between the first circuit components 337*c*1 and the conductive heat-emission portion 318 may be defined as a first height (H1), and a maximum height between the second circuit components 337*c*2 and the conductive heat-emission portion 318 may be defined as a second height (H2). In this case, if the second height (H2) is greater than the first height (H1) due to a thickness deviation between the first circuit component 337*c*1 and the second circuit component 337*c*2, the second adhesion portion 335*b* may be separated from the conductive heat-emission portion 318. Thus, the first and second step compensation members 355 and 356 may be provided to prevent the separation of the first adhesion portion 353*a* or second adhesion portion 353*b* due to the difference between the first height (H1) and the second height (H2) based on the difference deviation between the first circuit component 337*c*1 and the second circuit component 337*c*2.

The first step compensation member 355 having a first thickness (T1) may be attached to the rear surface of the first adhesion portion 353*a*, and may be attached to the conductive heat-emission portion 318. Accordingly, the first adhesion portion 353*a* may be attached to the conductive heat-emission portion 318 using first step compensation member 355. The first step compensation member 355 according to one embodiment of the present disclosure may include a conductive double-sided tape. The first step compensation member 355 may compensate for a height corresponding to the first thickness (T1) in the height deviation between the first height (H1) and the second height (H2) based on the thickness deviation between the first circuit component 337*c*1 and the second circuit component 337*c*2.

The second step compensation member 356 is configured to have a second thickness (T2) of 50 µm (micrometer) or more than 50 µm, and is attached to the rear surface of the second adhesion portion 353*b* and may be attached to the conductive heat-emission portion 318. Accordingly, the second adhesion portion 353*b* may be attached to the conductive heat-emission portion 318 by the use of second step compensation member 356. The second step compensation member 356 according to one embodiment of the present disclosure a conductive double-sided tape. The second step compensation member 356 may compensate for a height corresponding to the second thickness (T2) in the height deviation between the first height (H1) and the second height (H2) based on the thickness deviation between the first circuit component 337c1 and the second circuit component 337c2.

The cover member 350 according to another embodiment of the present disclosure compensates for the thickness deviation between the first circuit component 377c1 and the second circuit component 377c2 through the first step compensation member 355 and the second step compensation member 356 which are disposed at the different heights between the conductive heat-emission portion 318 and the adhesion portion 353 of the cover member 350, to thereby prevent the separation of the second adhesion portion 353b caused by the uneven surface portion (or deformation) of the flexible circuit board 337.

Selectively, it is possible to omit any one of the first step compensation member 355 and the second step compensation member 356.

Figure 12:
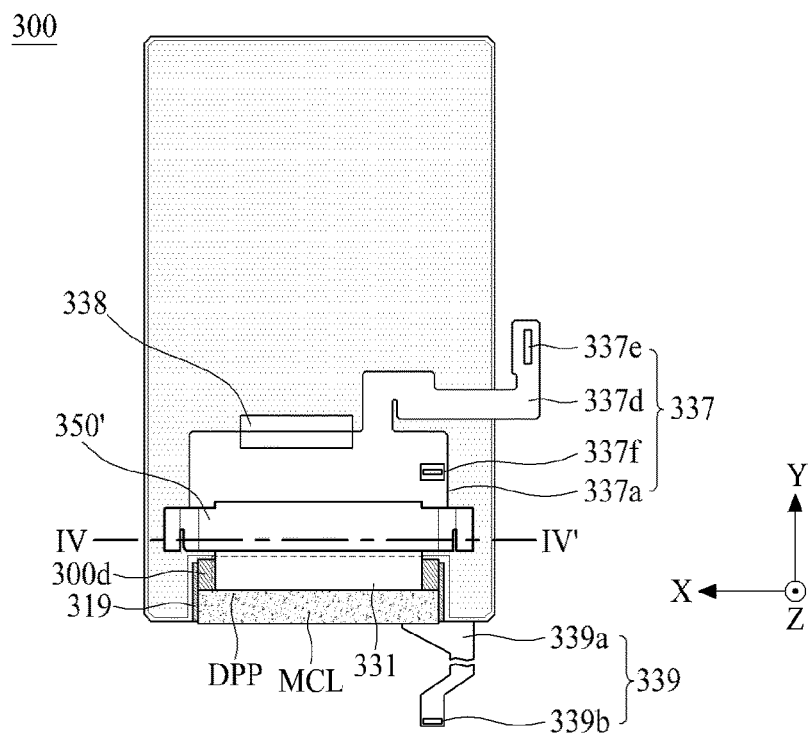
FIG. 12 illustrates a cover member according to another embodiment of the present disclosure.
Figure 13:
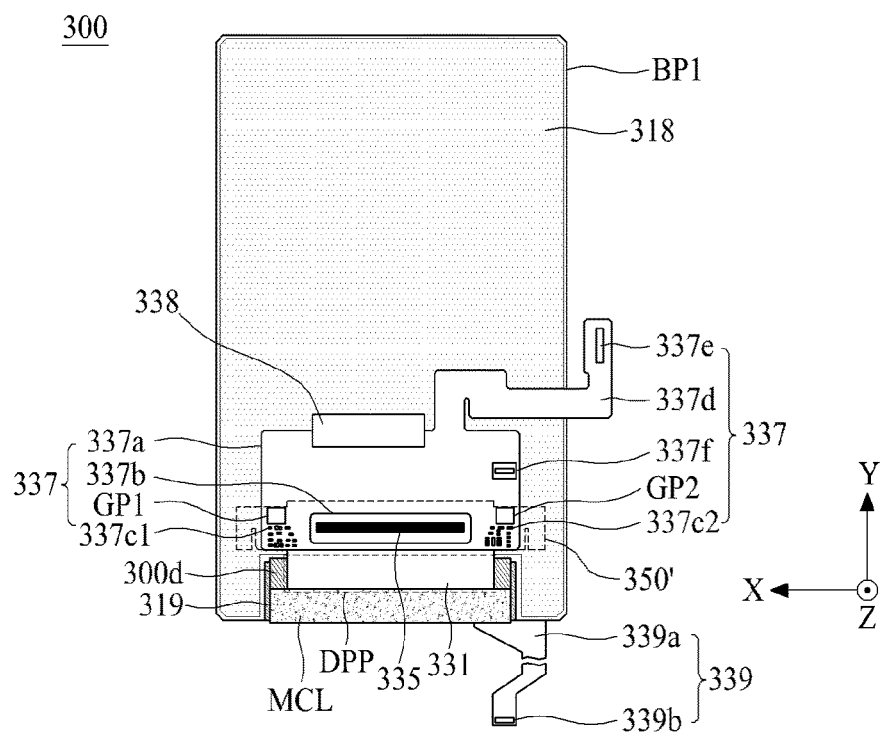
FIG. 13 illustrates a flexible display module obtained by removing a cover member from the flexible display module of FIG. 12 according to one embodiment of the present disclosure.
Figure 14:
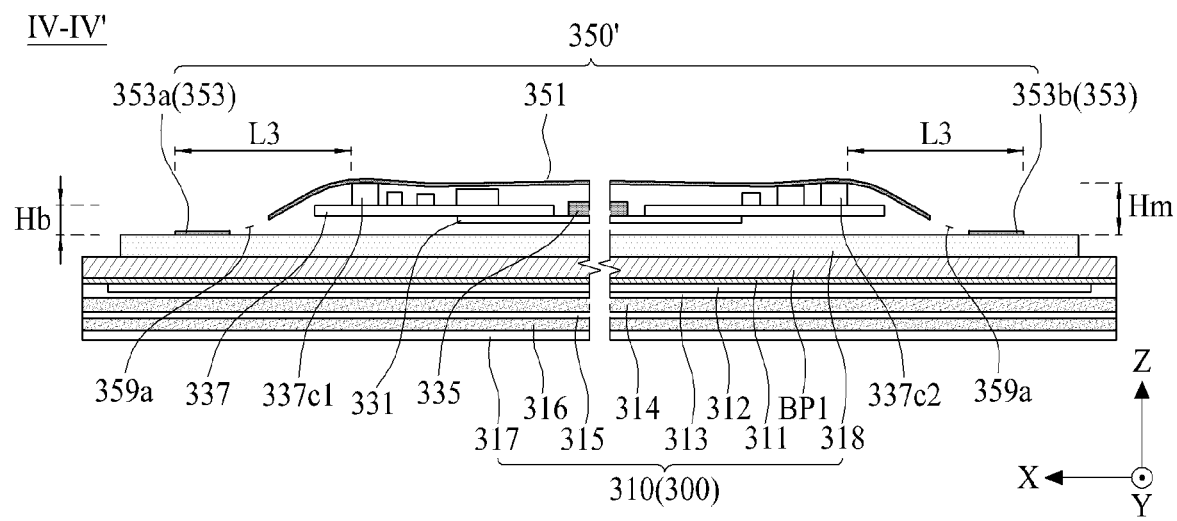
FIG. 14 is a cross sectional view along IV-IV' of FIG. 12 according to one embodiment of the present disclosure.
Figure 15:
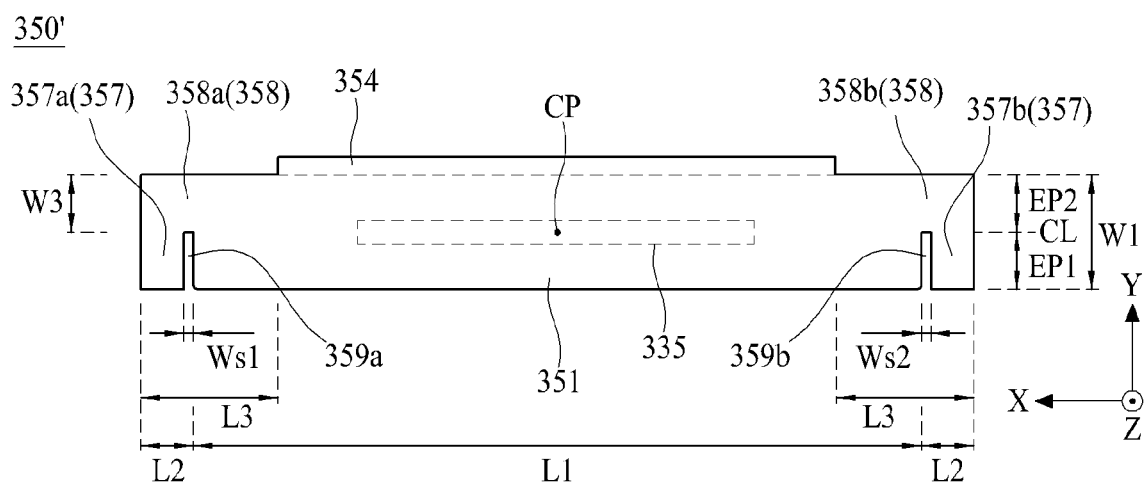
FIG. 15 is a plane view illustrating the cover member shown in FIGS. 12 and 14 according to one embodiment of the present disclosure.

FIG. 12 illustrates a cover member according to another embodiment of the present disclosure. FIG. 13 illustrates a flexible display module obtained by removing a cover member from the flexible display module of FIG. 12. FIG. 14 is a cross sectional view along IV-IV' of FIG. 12. FIG. 15 is a plane view illustrating the cover member of FIGS. 12 and 14.

Referring to FIGS. 12 to 15, the cover member 350' according to another embodiment of the present disclosure may include a cover body portion 351, an adhesion portion 357, and a bridge 358.

The cover body portion 351 shown in FIGS. 12 to 15 is identical in structure to the cover body portion shown in FIGS. 4 to 6, whereby a detailed description for the cover body portion 351 will be omitted.

The adhesion portion 357 is connected with both sides of the cover body portion 351, and may be attached to a rear surface of a flexible display panel 310. The adhesion portion 357 having a second length (L2), and a first width (W1), which is the same as the first width (W1) of the cover body portion 351, is connected with both sides of the cover body portion 351, whereby the adhesion portion 357 may be attached to a conductive heat-emission portion 318 of the flexible display panel 310.

The adhesion portion 357 according to one embodiment of the present disclosure may include a first adhesion portion 357a and a second adhesion portion 357b.

The first adhesion portion 357a having the first width (W1) and the second length (L2) is connected with one side (or left side) of the cover body portion 351, and may be attached to the conductive heat-emission portion 318 of the flexible display panel 310. The second adhesion portion 357b having the first width (W1) and the second length (L2) is connected with the other side (or right side) of the cover body portion 351, and may be attached to the conductive heat-emission portion 318 of the flexible display panel 310. Except that each of the first adhesion portion 357a and the second adhesion portion 357b has the first width (W1) which is the same as the first width (W1) of the cover body portion 351, the first adhesion portion 357a and the second adhesion portion 357b are identical in structure to the first adhesion portion 353a and the second adhesion portion 353b shown in FIGS. 4 to 6, whereby a detailed description for each of the first adhesion portion 357a and the second adhesion portion 357b will be omitted.

The bridge 358 is disposed between the cover body portion 351 and the adhesion portion 357, whereby the cover body portion 351 and the adhesion portion 357 may be connected with each other through the use of bridge 358. With respect to a second direction (Y, or width direction), the bridge 358 may connect both ends of the other edge portion (EP2) of the cover body portion 351 with the adhesion portion 357. The bridge 358 distributes a deforming force or a force causing uneven surface portions in a flexible circuit board 337, to thereby prevent a separation of the adhesion portion 357.

For example, with respect to the second direction (Y), one edge portion (EP1) of the cover body portion 351 is separated from the adhesion portion 357, and the other edge portion (EP2) of the cover body portion 351 is connected with the adhesion portion 357, whereby some of the deforming force (or force causing uneven surface portions) of the flexible circuit board 337 may be transmitted to the other edge portion (EP2) of the cover body portion 351, and the remaining of the deforming force (or force causing uneven surface portions) of the flexible circuit board 337 may be transmitted to one edge portion (EP1) of the cover body portion 351. Accordingly, some of the deforming force (or force causing uneven surface portions) of the flexible circuit board 337 may be transmitted to the adhesion portion 357 through the bridge 358 so that it is possible to prevent the separation of the adhesion portion 357 by the distribution of the deforming force of the flexible circuit board 337. And, the bridge 358 partially separates the cover body portion 351 and the adhesion portion 357 from each other so that it is possible to independently maintain an adhesion between the cover body portion 351 and ground pads (GP1, GP2) prepared in the flexible circuit board 337 and an adhesion between the conductive heat-emission portion 318 and the adhesion portion 357.

The bridge 358 according to one embodiment of the present disclosure may have a third width (W3), which is smaller than the first (W1) of the cover body portion 351, with respect to a width direction being parallel to the second direction (Y). For example, the third width (W3) of the bridge 358 may be more than the half of the first width (W1) of the cover body portion 351, and may be less than the first width (W1) of the cover body portion 351. Herein, if the third width (W3) of the bridge 358 is less than the half of the first width (W1) of the cover body portion 351, the bridge 358 may be cut by the uneven surface portions (or deformation) of the flexible circuit board 337. The bridge 358 may be formed by a cutting process for forming vertical slits 359a and 359b along a direction being parallel to the second direction (Y) in the cover member 350' between the cover body portion 351 and the adhesion portion 357.

The bridge 358 according to one embodiment of the present disclosure may include a first bridge 358a configured to connect the cover body portion 351 and the first adhesion portion 357a with each other, and a second bridge 358b configured to connect the cover body portion 351 and the second adhesion portion 357b with each other.

The first bridge 358a may be connected between the first adhesion portion 357a and one side (or left side) of the other edge portion (EP2) of the cover body portion 351. For example, a connection structure between the first adhesion portion 357a and the first bridge 358a may have a two-dimensional structure of "⌈" shape.

The second bridge 358b may be connected with the second adhesion portion 357b and the other side (or right side) of the other edge portion (EP2) of the cover body portion 351. For example, a connection structure between the second adhesion portion 357b and the second bridge 358b may have a two-dimensional structure of "¬" shape.

With respect to the first direction (X), each in a width (Ws1) of the first bridge 358a (or vertical slit) and a width (Ws2) of the second bridge 358b may be set to be more than a height (Hb) between an upper surface of the flexible circuit board 337 and the conductive heat-emission portion 318. Herein, if each in the width (Ws1) of the first bridge 358a and the width (Ws2) of the second bridge 358b is set to be less than the height (Hb) between the upper surface of the flexible circuit board 337 and the conductive heat-emission portion 318, each of the first adhesion portion 357a and the second adhesion portion 357b may be separated from the conductive heat-emission portion 318 by the uneven surface portions (or deformation) of the flexible circuit board 337.

The cover member 350' according to the embodiment of the present disclosure, as shown in FIG. 8, may include a conductive tape 350a and an insulating tape 350b, wherein a detailed repetitive description for the conductive tape 350a and the insulating tape 350b included in the cover member 350' will be omitted.

Accordingly, the cover member 350' according to one embodiment of the present disclosure may prevent or restrict the uneven surface portions of the flexible circuit board 337, and the force causing the uneven surface portions (or deforming force) of the flexible circuit board 337 may be distributed by the bridge 358 (or slits 359a and 359b) disposed between the cover body portion 351 and the adhesion portion 357, to thereby prevent the separation of the adhesion portion 353 from the conductive heat-emission portion 318. Also, it is possible to independently maintain the adhesion between the cover body portion 351 and ground pads (GP1, GP2) prepared in the flexible circuit board 337 and the adhesion between the conductive heat-emission portion 318 and the adhesion portion 357.

The cover member 350' according to another embodiment of the present disclosure may further include first and second step compensation members 355 and 356 shown in FIGS. 10 and 11, wherein a detailed repetitive description for the first and second step compensation members 355 and 356 will be omitted.

Figure 16:
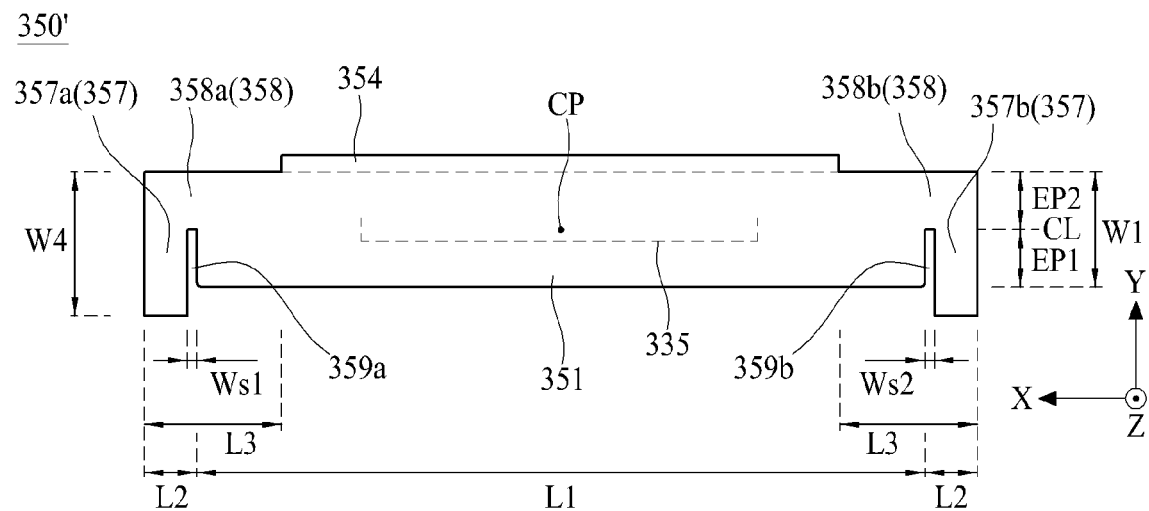
FIG. 16 is a plane view illustrating a modified embodiment of the cover member shown in FIGS. 12 and 14 according to one embodiment of the present disclosure.

Additionally, in case of the cover member 350' according to another embodiment of the present disclosure, the first and second adhesion portions 357a and 357b of the adhesion portion 357 may have a fourth width (W4), which is larger than the first width (W1) of the cover body portion 351, with respect to a width direction being parallel to the second direction (Y), as shown in FIG. 16. That is, the first and second adhesion portions 357a and 357b may have the fourth width (W4), which is more than the first width (W4) of the cover body portion 351, with respect to the width direction being parallel to the second direction (Y). In this case, an adhesion area between the conductive heat-emission portion 318 and each of the first and second adhesion portions 357a and 357b is increased so that it is possible to minimize the separation of each of the first and second adhesion portions 357a and 357b by the uneven surface portions (or deformation) of the flexible circuit board 337.

Figure 17:
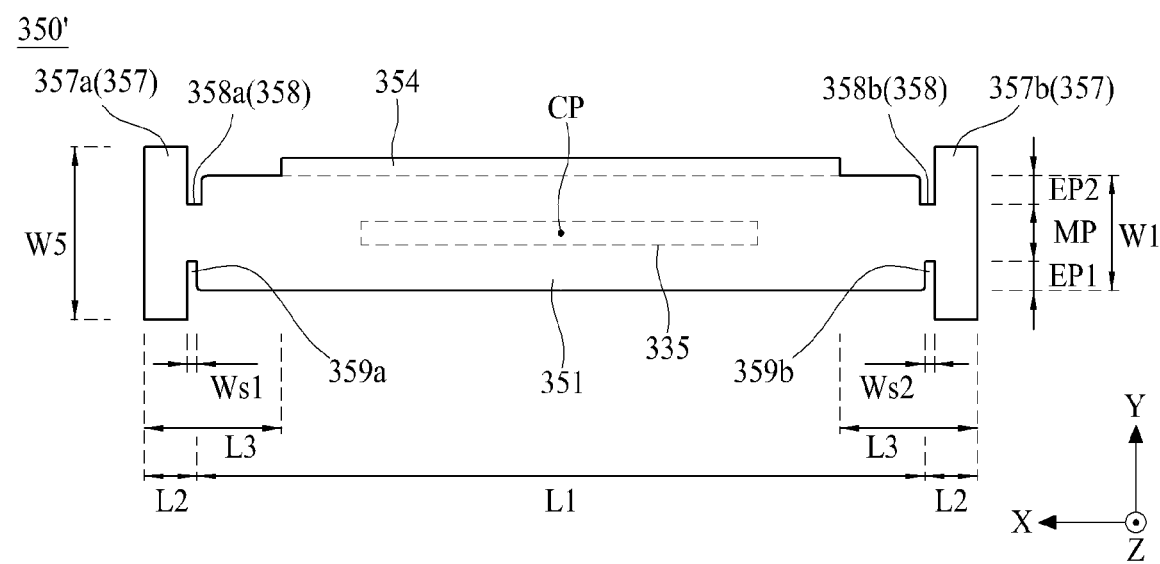
FIG. 17 illustrates a cover member according to another embodiment of the present disclosure.

FIG. 17 illustrates a cover member according to another embodiment of the present disclosure, which is obtained by changing an adhesion portion and a bridge in the cover member shown in FIG. 15 or 16. Hereinafter, the same reference numbers will be used throughout the drawings to refer to the remaining elements except the adhesion portion and the bridge, and related elements, and a detailed description for the same parts will be omitted.

Referring to FIG. 17 in connection with FIG. 14, in case of the cover member 350' according to another embodiment of the present disclosure, an adhesion portion 357 is connected with both sides of a cover body portion 351, and may be attached to a rear surface of a flexible display panel 310. The adhesion portion 357 having a second length (L2), and a fifth width (W5) which is larger than a first width (W1) of the cover body portion 351 is connected with both sides of the cover body portion 351, whereby the adhesion portion 357 may be attached to a conductive heat-emission portion 318 of the flexible display panel 310.

First, the cover body portion 351 may include one edge portion (EP1) and the other edge portion (EP2) which are parallel to each other with a middle portion (MP) interposed in-between with respect to a second direction (Y, width direction).

The adhesion portion 357 according to one embodiment of the present disclosure may include a first adhesion portion 357a and a second adhesion portion 357b.

The first adhesion portion 357a having the fifth width (W5) and the second length (L2) is connected with the middle portion (MP) of one side (or left side) of the cover body portion 351, and may be attached to the conductive heat-emission portion 318 of the flexible display panel 310. The second adhesion portion 357b having the fifth width (W5) and the second length (L2) is connected with the middle portion (MP) of the other side (or right side) of the cover body portion 351, and may be attached to the conductive heat-emission portion 318 of the flexible display panel 310. Except that each of the first adhesion portion 357a and the second adhesion portion 357b has the fifth width (W5) which is the larger than the first width (W1) of the cover body portion 351, the first adhesion portion 357a and the second adhesion portion 357b are identical in structure to the first adhesion portion 353a and the second adhesion portion 353b shown in FIGS. 14 to 16, whereby a detailed repetitive description for each of the first adhesion portion 357a and the second adhesion portion 357b will be omitted.

In the cover member 350' according to another embodiment of the present disclosure, a bridge 358 is disposed between the adhesion portion 357 and the middle portion (MP) of the cover body portion 351, whereby the cover body portion 351 and the adhesion portion 357 are connected with each other by the bridge 358. According as the bridge 358 is not connected with each of one edge portion (EP1) and the other edge portion (EP2) of the cover body portion 351, a force causing uneven surface portions (or deforming force) of the flexible circuit board 337 is distributed so that it is possible to prevent a separation of the adhesion portion 357.

With respect to a width direction being parallel to a second direction (Y), a third width (W3) of the bridge 358 according to one embodiment of the present disclosure is more than the half of the first width (W1) of the cover body portion 351, and is less than the first width (W1) of the cover body portion 351. Herein, if the third width (W3) of the bridge 358 is less than the half of the first width (W1) of the cover body portion 351, the bridge 358 may be cut by the uneven surface portions (or deformation) of the flexible circuit board 337. The bridge 358 may be formed by a cutting process for forming vertical (up-and-down side) slits 359a and 359b along a direction being parallel to the second direction (Y) in the cover member 350' between the cover body portion 351 and the adhesion portion 357.

The bridge 358 according to one embodiment of the present disclosure may include a first bridge 358a configured to connect the cover body portion 351 and the first adhesion portion 357a with each other, and a second bridge 358b configured to connect the cover body portion 351 and the second adhesion portion 357b with each other.

The first bridge 358a may be connected between the first adhesion portion 357a and one side (or left side) of the middle portion (MP) of the cover body portion 351. In this case, the first adhesion portion 357a may be connected with the middle portion (MP) of the cover body portion 351 through the first bridge 358a, however, the first adhesion portion 357a may be separated from each of one edge portion (EP1) and the other edge portion (EP2) of the cover body portion 351 through the use of slit 359a. Accordingly, a connection structure between the first adhesion portion 357a and the first bridge 358a may have a two-dimensional structure of "⊢" shape.

The second bridge 358b may be connected with the second adhesion portion 357b and the other side (or right side) of the middle portion (MP) of the cover body portion 351. In this case, the second adhesion portion 357b may be connected with the middle portion (MP) of the cover body portion 351 through the second bridge 358b, however, the second adhesion portion 357b may be separated from each of one edge portion (EP1) and the other edge portion (EP2) of the cover body portion 351 through the use of slit 359b. Accordingly, a connection structure between the second adhesion portion 357b and the second bridge 358b may have a two-dimensional structure of "⊣" shape.

The cover member 350' according to the embodiment of the present disclosure, as shown in FIG. 8, may include a conductive tape 350a and an insulating tape 350b, wherein a detailed repetitive description for the conductive tape 350a and the insulating tape 350b included in the cover member 350' will be omitted.

Thus, the cover 350' according to another embodiment of the present disclosure may provide the same effect as that of the cover member shown in FIGS. 14 to 16. Furthermore, the adhesion area with the conductive heat-emission portion 318 is increased so that it is possible to prevent the separation from the conductive heat-emission portion 318.

The cover member 350' according to another embodiment of the present disclosure may further include first and second step compensation members 355 and 356 shown in FIGS. 10 and 11, wherein a detailed repetitive description for the first and second step compensation members 355 and 356 will be omitted.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display module comprising:
    a flexible display panel including a display portion that displays an image via a front surface of the flexible display panel, a display pad portion that does not display the image, and a conductive heat-emission portion disposed on a rear surface of a flexible substrate, the display portion and the display pad portion disposed on the flexible substrate;
    a flexible circuit board connected with the display pad portion, the flexible circuit board arranged on a rear surface of the flexible display panel that is opposite the front surface, wherein the flexible circuit board includes at least one ground pad; and
    a cover member attached to the rear surface of the flexible display panel, the cover member covering uneven surface portions of the flexible circuit board, wherein the cover member includes:
        a cover body portion that overlaps the flexible circuit board, the cover body portion including a plurality of ends, the cover body portion attached to the conductive heat-emission portion and the at least one ground pad; and
        a plurality of adhesion portions attached to the rear surface of the flexible display panel, each of the plurality of adhesion portions extending from a corresponding one of the plurality of ends of the cover body portion, wherein at least one of the plurality of adhesion portions is attached to the conductive heat-emission portion;
        a conductive tape having the cover body portion and the plurality of adhesion portions; and
        an insulating tape attached to a rear surface of the conductive tape and disposed on the flexible circuit board, the insulating tape configured to include the cover body portion.

2. The flexible display module according to claim 1, wherein the cover body portion has a first width, and
    the plurality of adhesion portions each have a second width that is less than the first width.

3. The flexible display module according to claim 2, wherein the plurality of adhesion portions include:
    a first adhesion portion extending in a first direction from a first end of the plurality of ends of the cover body portion; and
    a second adhesion portion extending in the first direction from a second end of the plurality of ends of the cover body portion.

4. The flexible display module according to claim 3, wherein each of the first adhesion portion and the second adhesion portion includes at least one slit that is parallel to the first direction.

5. The flexible display module according to claim 3, wherein the cover member includes:

a first step compensation member attached to the first adhesion portion and the rear surface of the flexible display panel; and a second step compensation member attached to the second adhesion portion and the rear surface of the flexible display panel, wherein a thickness of the first step compensation member is different from a thickness of the second step compensation member.

6. The flexible display module according to claim 5, wherein the flexible circuit board includes:

a first circuit component having a first thickness, the first circuit mounted on a first edge area of the flexible circuit board; and a second circuit component having a second thickness mounted on a second edge area of the flexible circuit board, the second thickness different from the first thickness, wherein the cover body portion covers the first circuit component and the second circuit component.

7. The flexible display module according to claim 1, wherein the cover member further includes a slit between one of the plurality of adhesion portions and the cover body portion.

8. The flexible display module according to claim 1, wherein the cover member further includes a bridge connected between one of the plurality of adhesion portions and the cover body portion.

9. The flexible display module according to claim 8, wherein the bridge has a third width that is less than a first width of the cover body portion.

10. The flexible display module according to claim 8, wherein the cover body portion has a first width, and the plurality of adhesion portions each have a second width that is at least a same width as the first width.

11. The flexible display module according to claim 8, further comprising:

a bridge that connects the one of the plurality of adhesive portions to a first portion of an edge of the cover body, the one of the plurality of adhesive portions not connected to a second portion of the edge of the cover body.

12. The flexible display module according to claim 11, wherein one of the first portion or the second portion of the edge of the cover body portion is adjacent to the display pad portion.

13. The flexible display module according to claim 11, wherein the cover body portion includes a third portion of the edge that is are parallel to the first portion of the edge, a middle portion interposed in-between the first portion and the third portion, and the adhesion portion is separated from each of the first portion and the third portion of the edge, the adhesion portion connected with a middle portion of the cover body portion via the bridge.

14. The flexible display module according to claim 1, further comprising:

a panel flexible circuit film connected between the display pad portion and the flexible circuit board; and a driving integrated circuit mounted on the panel flexible circuit film, wherein the cover body portion covers one edge portion of the flexible circuit board and the driving integrated circuit.

15. The flexible display module according to claim 14, wherein the flexible circuit board includes a board opening portion, the board opening portion overlapping the driving integrated circuit, and the cover body portion covers the board opening portion.

16. The flexible display module according to claim 1, further comprising:

a housing covering the rear surface of the flexible display panel, the flexible display circuit board and the cover member disposed between the housing and the flexible display panel.

17. An electronic device comprising:

a cover window;

a flexible display module connected with the cover window, the flexible display module comprising:

a flexible display panel including a display portion that displays an image via a front surface of the flexible display panel, a display pad portion that does not display the image, and a conductive heat-emission portion disposed on a rear surface of a flexible substrate, the display portion and the display pad portion disposed on the flexible substrate;

a flexible circuit board connected with the display pad portion, the flexible circuit board arranged on a rear surface of the flexible display panel that is opposite the front surface, wherein the flexible circuit board includes at least one ground pad; and a cover member attached to the rear surface of the flexible display panel, the cover member covering uneven surface portions of the flexible circuit board, wherein the cover member includes:

a cover body portion that overlaps the flexible circuit board, the cover body portion including a plurality of ends, the cover body portion attached to the conductive heat-emission portion and the at least one ground pad;

a plurality of adhesion portions attached to the rear surface of the flexible display panel, each of the plurality of adhesion portions extending from a corresponding one of the plurality of ends of the cover body portion, wherein at least one of the plurality of adhesion portions is attached to the conductive heat-emission portion;

a conductive tape having the cover body portion and the plurality of adhesion portions; and an insulating tape attached to a rear surface of the conductive tape disposed on the flexible circuit board and configured to include the cover body portion; and a housing configured to support the cover window and to receive the flexible display module.

18. The electronic device according to claim 17, wherein the flexible display panel further includes a conductive heat-emission portion disposed in the rear surface of the flexible substrate, wherein the flexible circuit board includes at least one ground pad, wherein the cover body portion is attached to the at least one ground pad, and wherein the adhesion portion is attached to the conductive heat-emission portion.

\* \* \* \* \*